United States Patent
Sneh

(10) Patent No.: US 7,682,454 B2
(45) Date of Patent: Mar. 23, 2010

(54) PERIMETER PARTITION-VALVE WITH PROTECTED SEALS AND ASSOCIATED SMALL SIZE PROCESS CHAMBERS AND MULTIPLE CHAMBER SYSTEMS

(75) Inventor: Ofer Sneh, Boulder, CO (US)

(73) Assignee: Sundew Technologies, LLC, Broomfield, CO (US)

( * ) Notice: Subject to any disclaimer, the term of this patent is extended or adjusted under 35 U.S.C. 154(b) by 543 days.

(21) Appl. No.: 10/567,319

(22) PCT Filed: Aug. 9, 2004

(86) PCT No.: PCT/US2004/025612

§ 371 (c)(1), (2), (4) Date: Oct. 23, 2006

(87) PCT Pub. No.: WO2005/015613

PCT Pub. Date: Feb. 17, 2005

(65) Prior Publication Data
US 2007/0051312 A1     Mar. 8, 2007

(51) Int. Cl.
C23C 16/00 (2006.01)
C23F 1/00 (2006.01)
H01L 21/306 (2006.01)
C23C 16/06 (2006.01)
C23C 16/22 (2006.01)

(52) U.S. Cl. .................. 118/719; 118/729; 118/728; 118/733; 156/345.31; 156/345.32; 156/345.33; 156/345.34

(58) Field of Classification Search ........... 118/719, 118/729, 733; 156/345.31, 345.32, 345.33, 156/345.34
See application file for complete search history.

(56) References Cited

U.S. PATENT DOCUMENTS

| | | | |
|---|---|---|---|
| 4,439,261 A * | 3/1984 | Pavone et al. | 156/345.47 |
| 4,951,601 A | 8/1990 | Maydan et al. | |
| 5,007,981 A | 4/1991 | Kawasaki et al. | |
| 5,788,799 A * | 8/1998 | Steger et al. | 156/345.37 |
| 5,997,588 A * | 12/1999 | Goodwin et al. | 29/25.01 |
| 6,111,225 A * | 8/2000 | Ohkase et al. | 219/390 |
| 6,183,564 B1 * | 2/2001 | Reynolds et al. | 118/719 |
| 6,308,932 B1 * | 10/2001 | Ettinger et al. | 251/167 |
| 6,390,449 B1 * | 5/2002 | Ishigaki et al. | 251/193 |
| 6,394,733 B1 * | 5/2002 | Toda et al. | 414/221 |
| 6,409,837 B1 * | 6/2002 | Hillman | 118/712 |
| 6,517,048 B2 * | 2/2003 | Ettinger et al. | 251/167 |
| 6,663,714 B2 * | 12/2003 | Mizuno et al. | 118/719 |
| 6,827,789 B2 * | 12/2004 | Lee et al. | 118/719 |
| 6,846,380 B2 * | 1/2005 | Dickinson et al. | 156/345.31 |
| 6,902,623 B2 * | 6/2005 | Gurary et al. | 118/719 |

(Continued)

FOREIGN PATENT DOCUMENTS

JP         04193946 A  *  7/1992

(Continued)

*Primary Examiner*—Rudy Zervigon
(74) *Attorney, Agent, or Firm*—Patton Boggs LLP

(57) ABSTRACT

A seal-protected perimeter partition valve apparatus (450) defines a vacuum and pressure sealed space (401) within a larger space (540) confining a substrate processing chamber with optimized geometry, minimized footprint and 360° substrate accessibility. A compact perimeter partitioned assembly (520) with seal protected perimeter partition valve (450) and internally contained substrate placement member (480) further provides processing system modularity and substantially minimized system footprint.

50 Claims, 17 Drawing Sheets

U.S. PATENT DOCUMENTS

| | | | |
|---|---|---|---|
| 7,008,879 B2 * | 3/2006 | Lee et al. | 438/758 |
| 7,018,504 B1 * | 3/2006 | Raaijmakers et al. | 156/345.31 |
| 7,138,336 B2 * | 11/2006 | Lee et al. | 438/680 |
| 7,147,719 B2 * | 12/2006 | Welch et al. | 118/715 |
| 7,214,274 B2 * | 5/2007 | Wallace et al. | 118/719 |
| 7,247,207 B2 * | 7/2007 | Makino et al. | 118/719 |
| 7,276,124 B2 * | 10/2007 | Gurary et al. | 118/719 |
| 7,335,277 B2 * | 2/2008 | Makino et al. | 156/345.32 |
| 7,416,633 B2 * | 8/2008 | Makino et al. | 156/345.27 |
| 7,422,636 B2 * | 9/2008 | Ishizaka | 118/719 |
| 7,585,383 B2 * | 9/2009 | Oohirabaru et al. | 156/345.32 |
| 2001/0042514 A1 * | 11/2001 | Mizuno et al. | 118/728 |
| 2002/0144657 A1 * | 10/2002 | Chiang et al. | 118/723 E |
| 2002/0144786 A1 * | 10/2002 | Chiang et al. | 156/345.51 |
| 2003/0180458 A1 | 9/2003 | Sneh | |
| 2004/0083978 A1 * | 5/2004 | Welch et al. | 118/733 |
| 2004/0149214 A1 * | 8/2004 | Hirose et al. | 118/715 |
| 2005/0051100 A1 * | 3/2005 | Chiang et al. | 118/728 |
| 2005/0160983 A1 * | 7/2005 | Sneh | 118/715 |
| 2005/0193948 A1 * | 9/2005 | Oohirabaru et al. | 118/719 |
| 2005/0217578 A1 * | 10/2005 | Gurary et al. | 118/715 |
| 2006/0150904 A1 * | 7/2006 | Ozaki et al. | 118/715 |
| 2007/0051312 A1 * | 3/2007 | Sneh | 118/719 |
| 2007/0186857 A1 * | 8/2007 | Kim et al. | 118/723 R |
| 2007/0269983 A1 * | 11/2007 | Sneh | 438/689 |
| 2009/0156015 A1 * | 6/2009 | Park et al. | 438/758 |
| 2009/0176355 A1 * | 7/2009 | Okumura et al. | 438/513 |
| 2009/0209095 A1 * | 8/2009 | Horii | 438/585 |

FOREIGN PATENT DOCUMENTS

| | | |
|---|---|---|
| WO | WO 03062490 A2 * | 7/2003 |
| WO | WO 2005003406 A2 * | 1/2005 |

* cited by examiner

FIG. 14a  FIG. 14b

PERIMETER PARTITION-VALVE WITH PROTECTED SEALS AND ASSOCIATED SMALL SIZE PROCESS CHAMBERS AND MULTIPLE CHAMBER SYSTEMS

BACKGROUND OF THE INVENTION

1. Field of the Invention

This invention relates to the area of substrate processing systems and more specifically to a system and apparatus for transferring a substrate to a processing chamber and subsequently processing a substrate under sub-atmospheric pressure within a process chamber.

2. Description of Prior Art

Flat substrates, such as round silicon wafers, rectangular glass panels, round, rectangular and square ceramic plates and optical grade crystalline substrates are commonly used for the manufacturing of many useful devices such as integrated circuit (IC), flat panel display, optical, electro-optical, sensor and micro-fluidic devices. In many cases, these substrates are processed within single substrate processing-chambers. Substantially automatic transport of substrates into the process chambers and out of the process chambers is commonly practiced with a variety of useful different designs and a variety of useful wafer-handling systems architecture. Substrate handling systems significantly add to the size and cost of the processing apparatus. Accordingly, it is a common practice to exploit substrate handling and transport systems to support multiple single substrate chambers. Additionally, systems configurations with multiple single substrate processing chambers are advantageously exploited in many technologies to conduct sequential and integrated substrate processing wherein a sequentially processed substrate benefits substantially from the short delay between sequential processing and the ability to maintain controlled ambient during substrate transport from one process chamber to another, therefore substantially suppressing the adverse impact of ambient contamination.

One prominent example of such crucially integrated sequence of substrate processing is the deposition of copper barrier and copper seed film stack commonly implemented in semiconductor fabrication technology. Accordingly, silicon wafers are processed to grow a thin barrier layer in a first process chamber and subsequently quickly transported, under vacuum or controlled inert ambient, to a second processing chamber where a thin copper seed layer is formed over the previously formed seed layer. The performance of the copper barrier-seed stack predominantly depends on the quality of the interface between the barrier layer and the copper layer. The quality of this interface is predominantly improved by minimization of barrier layer surface contamination and oxidation related to the ability of integrated multiple substrate wafer processing systems to minimize the exposure of the wafers to possible contamination during wafer transport between the first processing chamber and the second processing chamber.

In an another prominent example, fabrication of flat panel display Organic Light Emitting Diode (OLED) devices crucially relies upon a series of 5-7 sequential fabrication process steps that must be carried within the processing system with extremely minimized exposure to moisture and other contamination sources during substrate handling between subsequent chambers and related processing steps.

Many commercially available processes such as chemical vapor deposition (CVD), etching, physical vapor deposition (PVD) or atomic layer deposition (ALD) are implemented at controlled ambient at the sub-atmospheric pressure range. Substrate transport is typically carried at vacuum or otherwise low pressure of inert ambient. During process execution, the process chambers are completely enclosed and pressure-sealed from the substrate-handling chamber. After process completion (or before process starts), the substrate is removed out of (or into) the process chamber without venting it to atmospheric pressure, such that low pressure and isolation from the ambient is maintained.

To facilitate the substrate transport and processing, processing systems are equipped with substrate translation means, substrate placement means and with volume partition means.

Substrate handling is practiced with a variety of robotic translation and rotation stages that are capable of moving a substrate in a certain plane. Many different devices are suitable and known to those who are skilled in the art including simple linear stages, simple rotation arms, rotation-translation robots and multiple-axes rotation-based robots.

Substrate placement refers to the removal of a substrate from a station and mounting that substrate over a substrate handling member and to the reversal operation of dismounting a substrate from a substrate handling member and subsequently mounting that substrate on a station. Station refers to a variety of processing and support chambers such as a load-lock station, an alignment station, processing stations, cleaning stations, a pre-heating station, a cooling station, pattern delineation stations, a bakeout station, post processing treatment stations, an outgasing station, etc. Substrate placement members comprise means for substrate exchange between the station and the substrate handling member such as a fork-like end-effector mounted on the substrate handling member and matching lift-pins or lift-fingers mounted on the station. substrate exchange requires vertical translation of the substrate. Many useful arrangements are successfully implemented and are known to those who are skilled in the art.

Volume partition is practiced to isolate stations during processing or otherwise when ambient conditions at different stations are not compatible, such as, for example, when a load-lock station is vented to atmospheric pressure. Typically volume partitions accommodate the basic architecture of the processing system and the substrate-handling member. For example, a planar partition, such as a slit-valve, is commonly practiced in the art wherein a substrate transport path is substantially linearly defined, when the partition is opened. A channel shaped as a horizontally oriented slit is formed in the wall of each chamber to facilitate a substrate transport port. The system further includes a substrate handling member with linear translation means such as a linear-rotation, linear-linear, linear-linear-rotation or a multiple-axes rotation robot. Multiple chamber systems of that design devote a significant space to enable the robot to align parallel to the linear access paths of different chambers. One of many such useful systems is described by Maydan et al. in U.S. Pat. No. 4,951,601. Planar partitions with horizontal substrate transport plane are typically implemented with the partition vertical to both the substrate transport plane and the substrate transport path to minimize partition size and related process chamber asymmetry. When more than one substrate transport path is necessary, the processing system implements a planar partition for each path.

In yet another, less common, example, perimeter volume partitions enable unobstructed access to a station when the partition is substantially opened. Substrate handling with a single axis rotation arm complements the system, although more sophisticated substrate-handling members are also suitable. One of several such useful systems in described by Kawasaki et al. in U.S. Pat. No. 5,007,981. Perimeter partitions are typically designed to be substantially vertical to the substrate-handling plane.

Optimum process chamber geometry dictates substantial similarity to the shape of the substrate. At the same time optimized flow path for process gasses commonly dictates that substantially sharp corners must be avoided. Accordingly, process chamber geometry should substantially replicate the shape of the substrate with provisions for round corners. For example, round geometry is most suitable for round substrates while round corners rectangular geometry best accommodates rectangular substrates.

Current implementation of planar partitions, or slit valves, conventionally employs a flat design which does not interface well with the symmetry of round process chambers. As a result, a substantially large cavity is created to adapt the round inner wall shape to the flat slit valve. This inevitable cavity breaks the (symmetry of the round process chamber with adverse impact on the symmetry, uniformity and consistency of various process elements, such as flow, plasma field, pressure and chemical transport. In addition, the parasitical cavity acts as a "dead space", creating flow turbulence that notoriously generates particles. Such dead-space cavities are particularly detrimental to the performance and optimization of atomic layer deposition (ALD), an emerging cutting edge process technology. The extent of the dead-space cavity impact on performance grows as the proportional area of the cavity compared to the chamber area is increased. Round process chambers utilizing slit-valves for volume partition were therefore forced into larger diameter chambers to create substantial separation between the substrate and the asymmetry source. Therefore, slit-valve-related asymmetry imposes an inevitable increase in chamber size. Additional process system increase emerges from the need to dedicate substantial space for the substrate-handling member to maneuver from one linear path through one planar partition into another linear path through another planar partition. For example, a large transport chamber is commonly used to accommodate a robot, linear substrate pickup, substrate and robot rotation and substrate placement. For example the system described in U.S. Pat. No. 4,951,601. Substrate transport chambers contribute substantially to the overall size of the processing system. With the increase in substrate size yielding substantially more devices per substrate and the trending of many industries into short product lifetime, fewer completed substrates and therefore fewer process chambers per system are necessary. Unfortunately, the relative impact of substrate process chambers on the overall size and cost of the processing system increases as the number of process chambers per system decreases making planar volume partitions such as planar slit-valves less favorable.

Perimeter partitions can be shaped to the optimum flow geometry and advantageously eliminate the adverse asymmetry effect. Unrestricted substrate handling within the substrate transport plane eliminates the need for a dedicated substrate-handling chamber with potentially much improved utilization of system area as well as substantially simplified substrate handling. However, despite these indisputable advantages, perimeter partitioned systems continue to be unpopular. Unfortunately, perimeter partitions also enhance problems that are inherent to volume partitions.

Most problematic, as well known to those who are skilled in the art, is the integrity and the cleanliness of the partition seals and related crevices. Crevices are inherently created when partitions are operated to enclose the chambers and relate to the surfaces between the moving part of the partition, typically defined as the "slide" and the stationary part of the partition typically referred as the "housing". As well known in the art, process chamber contamination and failure; are significantly driven by the growth of undesired films and/or accumulation of contamination at exposed crevices between the slide and the housing, as well as the deterioration of the seals by exposure to harsh chemical and/or plasma environment. Unfortunately, perimeter volume partitions typically introduce at least four times longer seals and related problematic slide-housing gaps.

In an attempt to reduce the adverse impact of seal related deterioration, the prior art utilized a vertically movable stage to elevate the process space between a process chamber top and a substrate holder substantially above the seals plane. Unfortunately, this prior art improvement does not completely resolve the problem, in particular, in the case of deposition processes. Therefore, further improvements could only be driven by substantially spacing the perimeter partition away from the process with a related significant chamber area increased.

Perimeter volume partition with protected seals was taught by the inventor of this invention in US patent application number 2003/0180458 and related applications. Accordingly, an atomic layer deposition (ALD) apparatus and method are provided wherein the seals of a "perimeter slot valve— (PSV)" are located within a small volume compartment of the process chamber space, named "DGIC" having a perimeter flow restriction at the inlet and a perimeter flow restriction at the outlet and an inert gas plenum for introduction of inert gas into the DGIC. This apparatus is suitable for process method wherein a substantially high flow of inert gas into the DGIC during the introduction of process reactive gas into the process chamber is useful as described in detail in US patent application number 2003/0180458. Accordingly, the seals of the PSV are substantially protected from contact with the reactive chemicals. As a result, a small diameter PSV apparatus was successfully implemented for a substantially small process chamber footprint with exceptional protection from seal-deterioration and contamination. However, the PSV apparatus of US patent application number 2003/0180458 is specific to the synchronously modulated flow and draw ALD (SMFD-ALD) method and does not provide a seal protected perimeter volume partition apparatus with easy application to other methods.

In addition, chambers defined with perimeter partitions lack the necessary wall area where essential accessories such as pressure gauges, pressure switches, electrical feeding ports (electrical feedthrough), sensors (such as temperature measurement, end-point detection, etc.), feeding ports, view ports, pumping ports, residual gas analyzers, feeding ports for in-situ cleaning gas, to name a few, are typically communicated with the chamber space through the chamber wall. Process chambers typically have minimized usable space at both the top and the bottom ends. The top end typically hosts process gas delivery members and is inherently unsuitable to communicate the accessories listed above with the process space. The bottom end is typically substantially crowded with a cumbersome substrate placement member leaving only very limited unoccupied area. In fact, many prior art implementations of substrate placement members required that vacuum pump ports were relocated from the bottom face and placed at the chamber walls. Accordingly, conventional substrate placement members leave very limited unoccupied area at the bottom of process chambers that is substantially insufficient for relocating the above listed essentials. Substrate holder elevators that were used to alleviate seal deterioration in the prior art of perimeter partitioning, as described above, further reduce the unoccupied area at the bottom end of the process chamber. Inevitably, this situation imposes an undesired chamber area increase to provide additional necessary space at the bottom end of the chamber.

A perimeter partition valve as practiced in the prior art is illustrated in the SHUT position in FIG. 1a. Accordingly, system volume is confined by a top plate 102, a bottom plate 104 and a system wall (not shown). A process chamber 100 includes lid 106 wherein process gasses are introduced into a gas distribution device 110 through conduit 108 and are further distributed through gas dispersion member 112. The chamber includes means to support a substrate 116 such as a heated chuck 114. The bottom face of the chamber 118 is predominantly crowded with substrate placement member 122. For example the substrate includes three pins 124 (only one shown) arranged on a circle at respective 120° from each other, as commonly practiced in the art. Perimeter partition valve 150 includes an L-shaped slide 152, top perimeter seal 154, bottom perimeter seal 156, bonnet 160, guides 162 and actuators 164. Seals 154 and 156 are made from a suitable elastomer such as Viton or Kalrez or other equivalent compounds. When perimeter partition valve 150 is SHUT seals 154 and 156 are pressed against sealing surfaces 166 and 168, respectively, to pressure seal the internal space of chamber 100. Three or four actuators 164 are conveniently arranged to actuate the slide between a SHUT position (FIG. 1a) and an OPEN position (FIG. 1b). When the perimeter partition valve 150 is actuated to the OPEN position (FIG. 1b) the substrate chuck 114 is accessible from 360° directions through perimeter slit 130. The substrate 116 is levitated by pins 124 (one out of three shown) to create gap 140 between the substrate 116 and the chuck 114 which is suitable for the insertion of a wafer handling end-effector (not shown). During processing, perimeter crevices 126 and 128 at the top and the bottom seal areas, respectively, are exposed to the process ambient resulting in unacceptable deterioration and contamination and overall inferior performance. Additionally, the bulky substrate placement member 122 occupies most of the area of bottom face 118 living very limited space 120 available for process and chamber accessories. As described above, perimeter partitioned chambers must accommodate process and chamber accessories at the bottom face of the chamber.

There is a need in the art to protect the seals of perimeter partition devices to avoid process chamber deterioration and contamination and to enable optimum perimeter partition apparatus with minimized process chamber and processing system area. Complementary, there is a need for improved substrate placement members and mainly to drastically reduce the area that these members obstruct at the bottom of process chambers and to enable mounting of chamber accessories and pumping ports, at the bottom end of the process chamber.

SUMMARY OF THE INVENTION

Embodiments within the invention circumvent the impairments of perimeter partition valves and substrate placement members to enable highly performing perimeter partitioned processing chambers with small footprint. It is the objective of this invention to substantially improve the performance of substrate processing chambers. In another scope the invention provides apparatus and method that reduce the size of processing chambers and processing systems. It is also within the scope of the invention to enhance the safety of substrate processing systems by providing fail-safe substrate placement members.

In one aspect the invention provides a substrate processing chamber comprising a substrate supporting member (414) located within a pressure sealed vessel (540) and a perimeter partition valve (PPV) (450) dispersed within the vessel. The PPV comprising a continuous perimeter sealing slide (252), a continuous perimeter seal (254), a continuous perimeter sealing surface (255), an actuator (464) for moving the sealing slide between an open position and a closed position, a perimeter gas distribution plenum (272), a perimeter gas flow drift channel (280) in serial fluidic communication downstream from the gas distribution plenum, an inert gas supply port (288) in serial fluidic communication upstream from the gas distribution plenum and an inert gas shutoff valve in serial fluidic communication upstream from the inert gas supply port. The perimeter seal is dispersed within the slide. Accordingly, the perimeter gas flow drift channel includes an outer end (280*a*) and an inner end (280*b*) and the outer end is substantially proximate to the perimeter seal. The PPV confines a pressure sealed portion (401) within the vessel when the perimeter sealing slide is actuated to the closed position. The pressure sealed portion is formed between the slide and the sealing surface using the seal and the pressure sealed portion includes the substrate support member. The PPV forms a perimeter access channel to the substrate support member when the PPV is actuated to the open position. Accordingly, the gas distribution plenum communicates a substantially unified flow of inert gas from the inert gas supply port to the outer end of the drift channel when the shutoff valve is open and the drift channel further communicates the inert gas into the pressure sealed portion of the vessel when the shutoff valve is open.

In another preferred aspect of the invention the substrate processing chamber preferably includes a continuous sliding perimeter protection member (276) preferably attached to the inner side of the perimeter sealing slide. This sliding perimeter protection member preferably forms the perimeter gas flow drift channel (280) when the PPV is actuated to the closed position. Preferably, the perimeter protection member substantially covers the inner portion of the perimeter sealing slide. Preferably, the substrate processing chamber comprises a stationary perimeter protection member (270) and a substantially restricted perimeter gas distribution plenum is preferably formed between the sliding perimeter protection member and the stationary perimeter protection member when the PPV is actuated to the closed position. In another preferred modification the sliding perimeter protection member preferably defines a portion of the inner wall of the process chamber and preferably forms a perimeter gas flow path with a substantially round top corner. Preferably, the stationary perimeter protection member defines a portion of the inner wall of the process chamber and preferably forms a perimeter flow path with a substantially round bottom corner.

In a preferred implementation the substrate processing chamber further comprises an outer perimeter seal (258), a vessel perimeter sealing surface (259) and a lid (206) with a perimeter sealing surface (255). Preferably the outer perimeter seal is dispersed within the slide. The outer perimeter seal preferably forms a pressure tight communication with the vessel perimeter sealing surface when the PPV is actuated to the closed position and the perimeter seal preferably forms a pressure tight communication with the lid perimeter sealing surface when the PPV is preferably actuated to the closed position. Accordingly, the lid is preferably removable to provide access to the chamber and the perimeter seal while a pressure tight isolation between the chamber and the vessel is preferably maintained when the PPV is actuated to the closed position and the lid is removed. In a preferred implementation the substrate processing chamber includes a substrate placement assembly (850) which is preferably actuated to provide vertical substrate translation and the actuation is substantially contained within the process chamber. Preferably, the actuation is pneumatic. Preferably, the substrate processing chamber includes a pneumatic actuator (890) and the actuator is preferably operated by pressurizing the pneumatic actuator to translate the substrate vertically up and evacuating the pneumatic actuator to translate the substrate vertically down. Accordingly, the invention substantially enhances the safety of the processing chamber.

In another aspect the invention discloses a substrate processing chamber comprising a substrate support member (364) and a substrate placement member (850) wherein the substrate placement member is actuated to provide vertical substrate translation and the actuated substrate placement member is substantially contained within the process chamber. Preferably the substrate placement member is pneumatically actuated. In a preferred aspect the substrate processing chamber preferably comprises a pneumatic actuator (890) wherein the pneumatic actuation preferably includes pressurizing the pneumatic actuator to translate the substrate vertically up and evacuating the pneumatic actuator to translate the substrate vertically down.

In another aspect the invention discloses a substrate processing system comprising a substrate processing system vessel (540) and a substrate processing chamber (400) wherein the processing system vessel includes a pressure tight vessel space, a top vessel plate (402), a bottom vessel plate (404), a top port (406) and a bottom port (407) and the substrate processing chamber comprises a perimeter partitioned assembly (PPA) (520) and a lid assembly (560) and the PPA includes a substrate supporting member (414), a PPV (450) having a perimeter PPV bonnet (451), a substrate placement member (500), a pumping port (426) and an accessory port (444) and the lid assembly comprises a gas delivery manifold (408). wherein the bottom port is formed within the bottom vessel plate of the processing system vessel and the top port is formed within the top vessel plate of the processing system vessel. The PPV bonnet is pressure sealed to the bottom port of the processing system vessel and the lid assembly is pressure sealed to the top port of the processing system vessel to form the substrate processing chamber. Preferably, the substrate placement member is actuated to provide vertical substrate translation and the actuation is substantially contained within the process chamber. In one preferred aspect the processing system vessel further includes a substrate translating member. In another preferred variant the substrate processing system comprises a load-lock chamber (710). Preferably, the load-lock chamber includes a bottom load-lock assembly and a top load-lock assembly and the bottom load-lock assembly is preferably pressure sealed to the bottom port of the processing system vessel and the top load-lock assembly is preferably pressure sealed to the top port of the processing system vessel to form the load-lock chamber. In a preferred aspect the substrate processing system is an ALD system. In yet another aspect the substrate translating member preferably comprises a substrate handling robot (780). In another preferred modification the substrate processing system preferably comprises a plurality of the processing chambers and the substrate translating member preferably includes a multiple lever rotation member (1270) comprising equally spaced number of substrate pickup levers wherein the number of levers equals the number of the plurality of processing chambers. Accordingly, substrate translating preferably includes sequentially rotating all of the substrates in one direction and sequentially processing all of the substrates.

In a preferred aspect the processing system preferably comprises a plurality of the processing chambers where the plurality of processing chambers is preferably substantially arranged on a single line. Preferably, the substrate translating member comprises a multiple lever linear translation member. The multiple lever linear translation member preferably comprises an equally spaced number of substrate pickup levers where the number of levers equals the number of the plurality of processing chambers and the substrate translating preferably includes sequentially translating all of the substrates in one direction and sequentially processing all of the substrates. Additionally, the substrate processing system is preferably attached to a wafer handling chamber (1298) wherein a slit is preferably formed in the wall of the pressure tight vessel space and a slit valve (1292) preferably forms a pressure tight communication with the processing system and the wafer handling system. In a preferred implementation the multiple lever linear translation member preferably includes a first set of levers, a second set of levers, the first set of levers and the second set of levers are preferably spaced to substantially match the center to center distance between the process chambers. Wherein the levers are preferably translatable forward and backward in the direction of the single line. Preferably sequentially translating all of the substrates includes removing a completed substrate from a last processing chamber, elevating the substrates by using the substrate placement member, preferably moving the first set of levers backwards to substantially locate under the substrates; preferably moving the second set of lever forwards to substantially locate under the substrates, preferably lowering the substrates using the substrate placement member to place the substrates on the levers, preferably translating the substrates forwards to the next the processing chamber by moving the first set of levers and the second set of levers concurrently, preferably Moving the first set of levers forward and moving the second set of levers backwards to substantially locate both sets of levers between the processing chambers and preferably loading a substrate into a first processing chamber.

In another aspect the invention teaches a method for improving the safety of substrate placement members within a processing chamber comprising containing the wafer placement member within the processing chamber, containing the pneumatic actuator of the wafer placement member within the processing chamber and actuating the wafer placement member within the processing chamber where actuating comprises pressurizing the actuator to elevate the substrate placement member and evacuating the actuator to lower the substrate placement member.

DETAILED DESCRIPTION OF THE PREFERRED EMBODIMENT

A. Seal Protected Compact Perimeter Partition Valve

The perimeter partition valve (PPV) with perimeter seal protection according to the invention is practiced with a combination of gas plenum and a perimeter drift channel to effectively maintain a directional flow of inert gas out of the seal area. The perimeter gas plenum delivers a substantially unified flow of inert gas to the perimeter drift channel. The drift channel defines a high velocity flow of inert gas that minimizes the diffusion of reactive species to the seal area. Improved maintainability is achieved with removable perimeter shields (liners) wherein unavoidable deposition or condensation of film deposits is substantially limited onto easily removable parts. A removable sliding liner attached to the PPV slide provides for a smooth and round process chamber corner and a substantially long seal protecting drift channel. Complementary, a stationary liner integrates with the sliding liner to define a smooth gas flow path around the substrate support member. The seam between the sliding liner and the stationary liner defines an additional drift channel wherein a minimized flow of inert gas substantially prevents deposition or condensation of contaminating deposits.

Figure 1A:
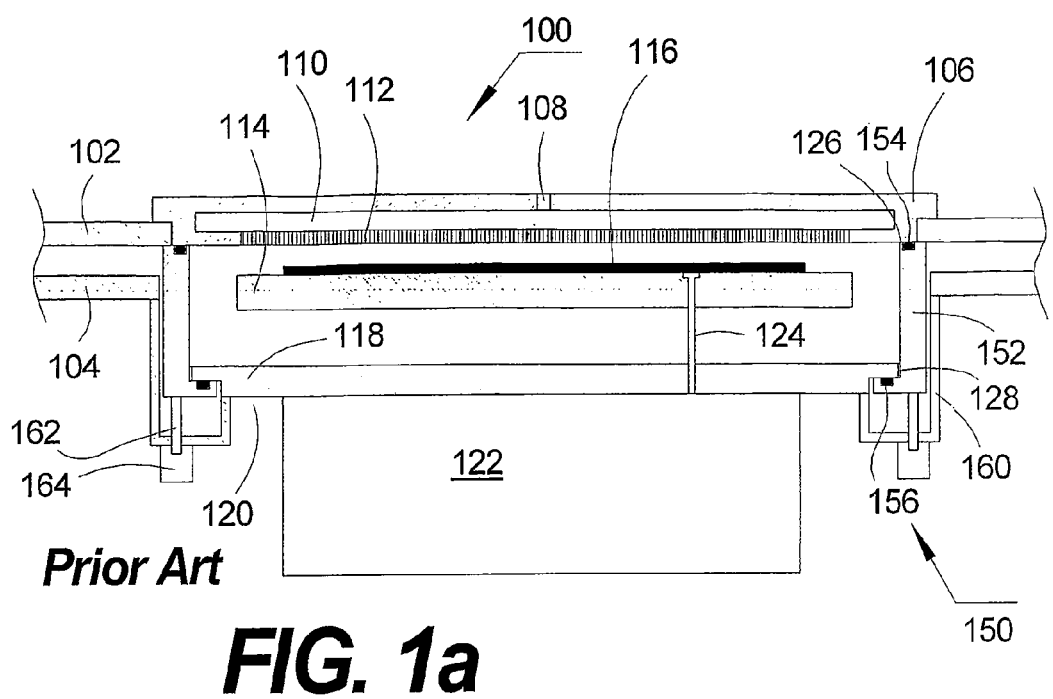
FIG. 1 depicts schematically the prior art layout of a perimeter partitioned chamber.
Figure 1B:
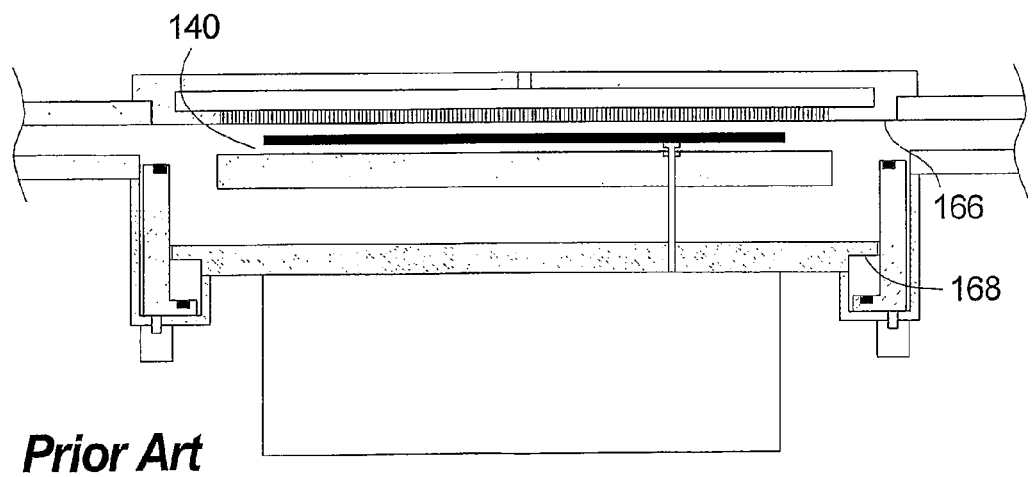
Figure 2A:
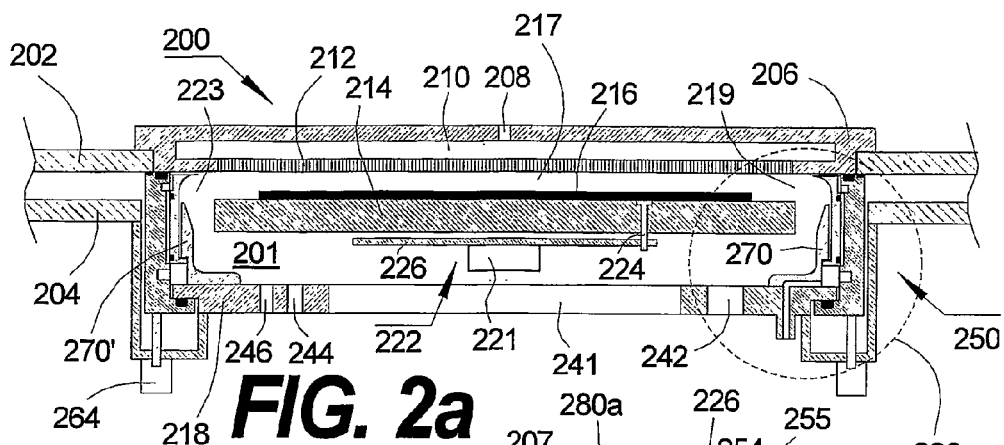
FIG. 2 depicts schematically the layout of a seal protected perimeter partitioned chamber according to the invention.
Figure 2B:
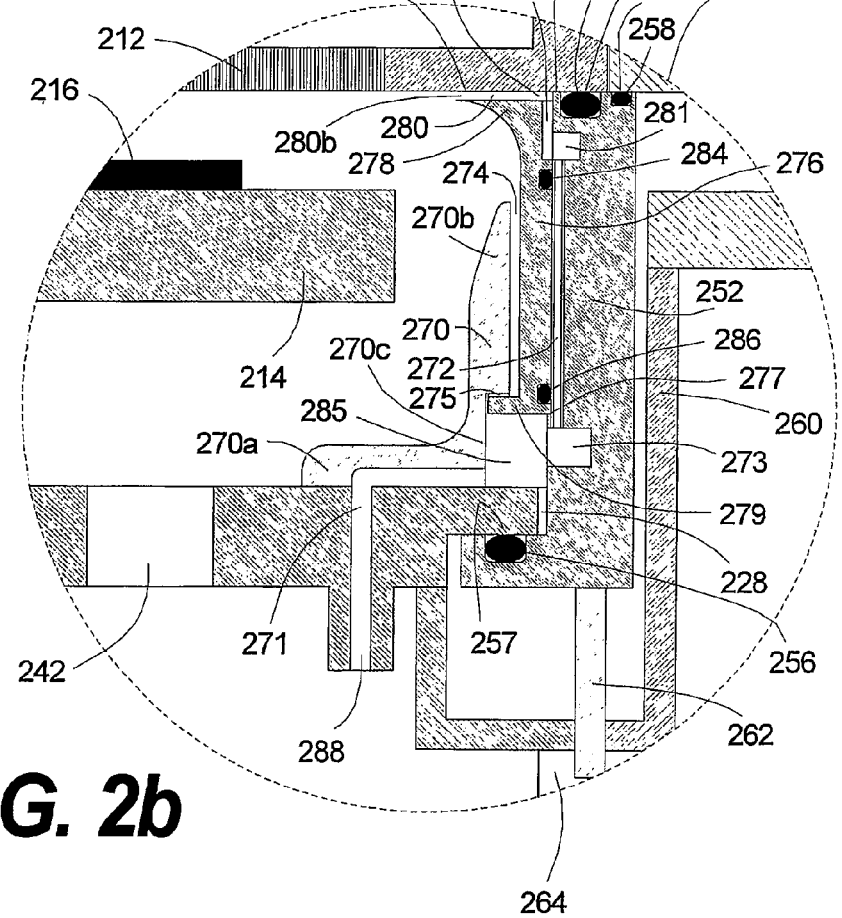

For example, a perimeter partition valve with protected seals, 250, is depicted in FIGS. 2a and 2b. FIG. 2a illustrates chamber 200 comprising lid 206, process fluid inlet 208, process fluid distribution member 210 and gas dispersion element 212, chuck 214 supporting substrate 216 and bottom plate 218 having multiple accessory ports such as 242, 244 and 246 and pumping port 241. Substrate placement member 222 is dispersed within the internal space 201 of chamber 200. Three lift pins 224 (only one is shown) are 1200 spaced as commonly practiced in the art and are communicated with the actuating device 221 through tripod 226 (shown schematically communicated with pin 224). Inset 290 (shown in a larger scale in FIG. 2b) further illustrates schematically the right side of a perimeter partition valve 250.

Perimeter partition valve 250 includes slide 252 having top perimeter seals 254 and 258 and bottom seal 256. Seals 254 and 256 form a pressure tight enclosed space 201 with sealing surfaces 255 and 257, respectively, when slide 252 is actuated to the closed "SHUT" position. Bonnet 260 provides the space for slide actuation by actuators 264 and guides 262. The perimeter partition valve (PPV) further includes a perimeter sliding liner 276 attached to slide 252 to maintain a well defined narrow top perimeter narrow gap 280 between the top 278 of sliding liner 276 and the bottom surface 207 of lid 206. Gap 280 defines a flow drift channel with an upstream outer end 280a located in proximity to seal 254 and a downstream inner end 280b directed into the chamber. A stationary perimeter liner 270, preferably split into two halves 270 and 270' is mounted on bottom 218 having a horizontal portion 270a, a vertical portion 270b and a step portion 270c. Stationary liner 270 substantially overlaps sliding liner 276 to create a well defined perimeter gap 274 between the vertical portion 270b of stationary liner 270 and the inner side of sliding liner 276. Perimeter space 285 is formed between step 270c and lip 279 of liner 276. Gap 274 preferably defines a flow drift channel from perimeter space 285 into the chamber. Perimeter grooves 281 and 273 at the top and the bottom of slide 252, respectively, are formed into the internal wall of slide 252. Groove 273 is communicated with space 285 and groove 281 is communicated with perimeter space 282 that is formed between a step machined into liner 276 and slide 252. Perimeter spaces 273 and 281 are communicated through a multiple number of channels, preferably capillary tubing 272 (one shown) that are welded or brazed into the inner wall of slide 252. For example, channels 272 may be 40 commercially available precision capillary stainless steel tubing with 0.508 mm outer diameter and 0.254 mm inner diameter and a length of 40 mm.

Liner 276 has an outer diameter that is slightly smaller than the inner diameter of slide 252 to compensate for mechanical mismatch. Seals 284 and 286 located at the top and the bottom of liner 276, respectively, are supported by respective seals grooves to substantially seal the gap between slide 252 and liner 276. Preferably, seals 284 and 286 are made of material such as Teflon PFA or PTFE or their composites. Liner 276 slides into position to rest against step 277 and defines a well-controlled level difference 280 between the end of slide 252 and the end of liner 276. Level difference 280 forms a well-defined and substantially narrow perimeter drift channel with the bottom of the lid surface 207 when the perimeter partition valve 250 is closed. Once in position liner 276 is secured to slide 252 using, for example, screws, locking pins or other anchoring means (not shown). Capillaries 275 are attached into the top of lip 279 to create multiple well-defined gas restricting flow-channels when lip 279 is in proximity to portion 270b of stationary liner 270. For example, channels 275 may be 20 commercially available 0.1275 mm inner diameter stainless steel precision tubing with a 1 cm length.

During processing, when perimeter partition valve 250 is shut, Inert gas inlet 288 is employed to introduce purge gas into perimeter space 285 through channel 271 and pressurize perimeter spaces 285 and 273. Preferably, a mass flow controller (MFC, not shown) is employed to indirectly regulate the pressure in spaces 285 and 273 by controlling the desired flow. Capillaries 272 define a plenum of gas distributed into the process chamber space 201 through perimeter spaces 281 and 282 and drift channel 280 wherein the flow restriction is substantially formed by capillaries 272 that are equally dispersed to form a substantially equally dispersed flow out of perimeter flow drift channel 280 around the perimeter. Capillaries 275 define a plenum of gas distributed into the process chamber space 201 through perimeter gap 274 wherein the flow restriction is substantially formed by capillaries 275 that are preferably equally dispersed to form a substantially equally dispersed flow out of perimeter flow channel 274 around the perimeter. For example the conductance of 40 0.254 mm inner diameter×40 mm long capillaries 272 from a 20 Torr pressure within space 273 into a 1 Torr pressure within chamber space 201 is ~0.008 liter/sec (for nitrogen at room temperature) and the conductance of 20 0.1275 mm×10 mm long capillaries is 0.0009 liter/sec. Accordingly, the flow into the chamber space 201 from perimeter flow drift channel 280 and 274 is ~12 sccm and the flow into chamber space 201 through flow channel 274 is ~1.5 sccm. To maintain a selected level of flow relatively independent of chamber temperature and gas temperature drift the inert gas glow into inlet 288 is preferably controlled by a MFC. The flow of inert gas out of perimeter channels 280 and 274 substantially prevents the contact of reactive process gas with seals 254 and 256, respectively and substantially prevents the growth of deposits into gaps 226 and 228, respectively, therefore substantially resolves the prior art deficiencies that prevented, so far, widespread implementation of perimeter partition valves. The flow restriction of the plenum such as capillaries 272 and 275 and the flow levels are selected to optimize each process for maximized protection to the perimeter partition valve while minimizing the impact on the process. Significant seal protection is achieved with very mild, 10-50 sccm levels of flow compared to higher 200-1000 sccm levels of flow that are typically implemented in commercial CVD, PECVD, ALD, PVD, RIE etc. As a result, perimeter partition valves were successfully implemented and maintained over substantially long maintenance intervals With a very small 20-40 mm gap between the inner diameter of the perimeter partition valve 250 and the outer diameter of the substrate supporting member 214, therefore enabling, for example, the implementation of process chambers for the processing of 300 mm round wafers, with the process chambers having only a 425 mm outer diameter. A flow path with substantially round corners is preferably defined by the shape of liners 276 and 270 to optimize flow properties around the edge of substrate supporting member 214. Additionally, most implementations apply perimeter flow restriction zone 219 substantially above the exposed area of substrate supporting member 214 to create a small pressure, gradient between the substrate space 217 and the seal protection space 223.

Additional perimeter seal 258 is used to maintain the vacuum integrity outside of chamber space 201 when the chamber lid 206 is opened to allow an access to the chamber or to seal 254. This arrangement provides an improvement to the prior art by further reducing contamination source in the chamber as it eliminates the exposure of lid sealing members to harsh process ambient.

The number of PPV actuators 264 is determined by the size and geometry of the substrate. For example, 3 actuators are suitable to accommodate relatively small size substrates up to ~200 mm diameter or 150×150 mm square. In yet another example PPV that accommodates rectangular 550×675 mm substrates preferably requires 4-5 actuators.

B. Compact Substrate Placement Member

Vertical translation provided by substrate placement members is actuated in the prior art substantially outside the chamber wherein vertical motion was appropriately fed through the bottom of the chamber. To facilitate the necessary pumping and accessory ports at the bottom of a minimized size perimeter partitioned chamber, a substrate placement member 850 according to the invention is entirely contained within process chamber space 301 of processing chamber 800 and communicated with the a small size gas line utilized to control the pressure inside the actuating device, as described in detail below, in reference to FIG. 3.

Figure 3:
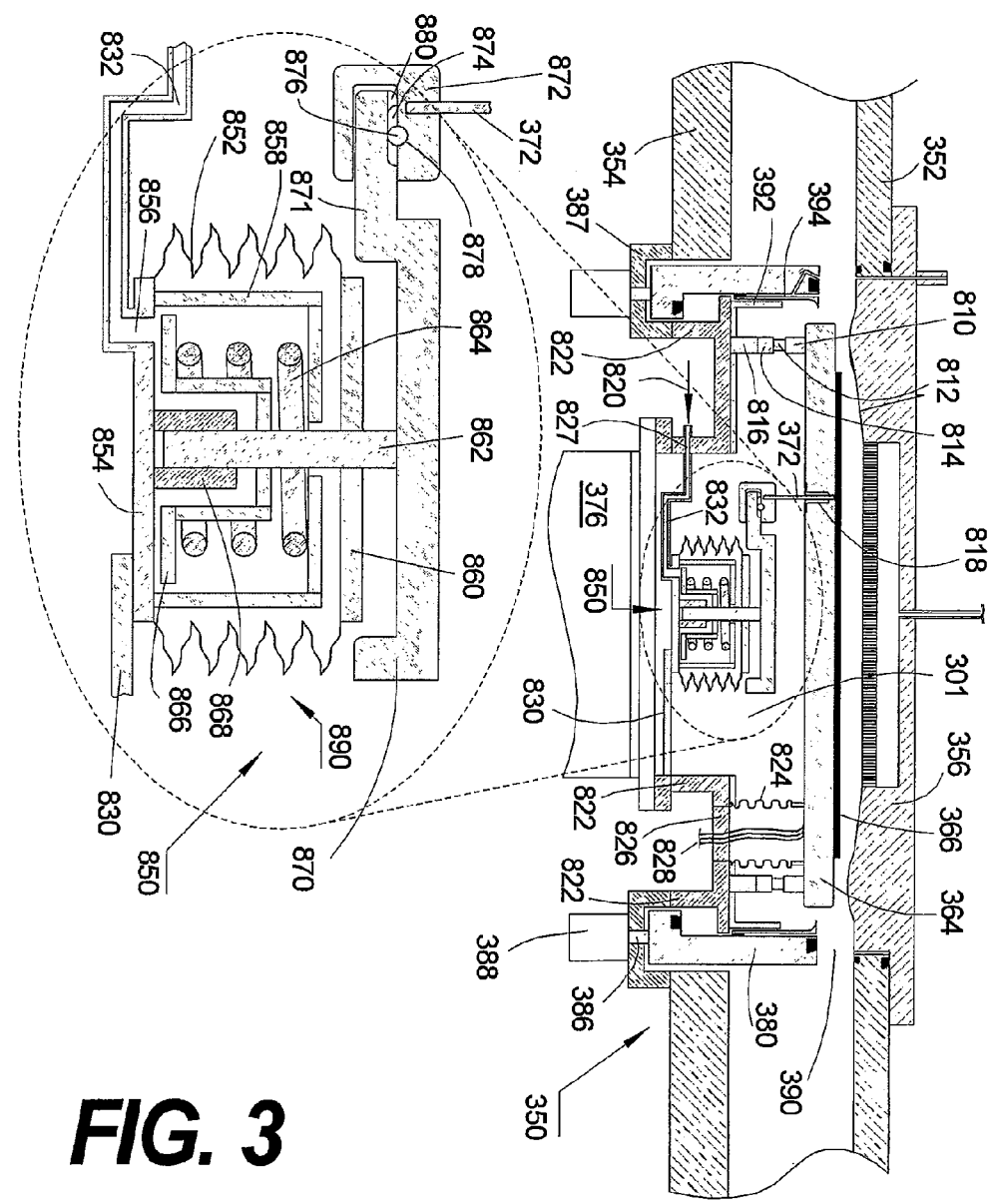
FIG. 3 depicts schematically a cross sectional view of a chamber contained low-profile lift-pins assembly according to the invention.

FIG. 3 depicts process space 350 in a schematic side-cross-sectional view. Chuck 364, for example a cast aluminum resistive heater, supports substrate 366. Chuck 364 comprises three cast-in stainless steel threaded posts 810 (only 2 are shown). Typically posts 810 are distributed at the perimeter of the heater and are 120° apart. For simplicity, FIG. 3 shows two posts as if they are located at 180° with respect to each other. Bolts 812 are fastened into threaded posts 810 to facilitate chuck mounting and some height adjustment. Bolts 812 run into threaded posts 810 and rotate freely on their bottom end within bearings 814. Posts 816 are used to mount chuck 364 to flange 822. The physical dimensions of heater support sub-assemblies 810+812+814+816 are optimized to produce appropriate heat loss mechanism to improve the temperature control of chuck 364. Counter intuitively, we have found that the thickness of the heater support assemblies 810+812+814+816 was typically dictated by the need to provide substantial heat loss to improve temperature controllability while the needs dictated by mechanical considerations of integrity and rigidity could typically be satisfied with thinner sub-assemblies. For example, the optimized choice for a 200 mm wafer size ALD chamber had to exceed 1" thick stainless steel (304 alloy) to provide adequately stable temperature control within ±1° C. between the temperature range from 100-300° C.

The power and thermocouple cables, 828, of cast heater 364 are located within stainless steel conduit 824. Typically, a hydroformed bellow was convenient to use as a conduit. The conduit is cast-into the heater on one end and was sealed with an o-ring to flange 822 over opening 826 at the cold end. Stationary liner 392 provides holes opening to allow heater mountings 810+812+814+816 to bolt directly onto flange 822 and to enable attachment of conduit 824 through opening 826.

Flange 822 is attached to the PPV bonnet 387 and communicates between the PPV assembly and the vacuum pump 376 (or an isolation gate valve leading to a vacuum pump). In addition to opening 826, flange 822 includes other utility ports such as port 827 that is used to run the pneumatic line for the substrate placement member, for example lift pins 372, outside of the vacuum zone. Lift-pins assembly 850 is mounted over bracket 830. If the process requires high pumping speed, bracket 830 is designed to maximize the rigidity and the precision of mounting assembly 850 while maintaining most of the area of flange 822 open for maximized conductance to pump 376. In FIG. 3 bracket 830 is shown only on one side to represent that in this particular cross-sectional view the other side is entirely open.

Actuator assembly 890 is utilized to vertically translate a lift pins mechanism. Typically, between 3-4 lift pins 372 (only one shown, 3 pins are common while 4 pins are sometimes needed for substantially elongated substrates) are assembled and run through sleeves 818 and through the chuck 364. Assembly 890 is detailed in the inset of FIG. 3. Pins 372 are supported by sliding mount 872. For the sake of clarity we describe a mechanism for three lift pins that is suitable for placement of many different substrates. Tripod 870 is used to push the pins up or to pull them down. Tripod 870 has three levers 871 (only one shown) that are spaced 120° apart (one per each lift-pin). Annular groove 874 is used to support sliding mount 872 using a ceramic ball 876. Ball 876 is matched with round pit 878 that is machined into sliding mount 872. This assembly enables some lateral and pivotal tolerance of pins 372 to enable self-compensation of minor misalignment. To improve reliability, ball 876 is preferably slightly lubricated with ultra high vacuum compatible lubricant such as Fumblin® grease, Krytox® grease and the like, or dry molybdenum disulfide. Alternatively, ball 876, pit 878 and groove 874 are lined with friction reducing coatings such as the commercially available PTFE composite Frelon® or equivalents. Also shown is grove 880 which is used to assemble sliding mounts 872 and ball 878 over levers 871.

Tripod 870 is fastened to guiding post 862 which is mounted into linear bearings 868. Accordingly, post 862 is translatable with precision vertically through the guidance of bearing 868. An actuator chamber is defined by top flange 860, bellow 852 and bottom flange 854. Top flange 860 is fastened to post 862. Bottom flange 854 includes an opening 856 and pneumatic line 832. Bottom flange 854 is mounted onto bracket 830. The actuator (890) includes a preloaded spring 864 and spring stator 858. Spring piston 866 is fastened to post 862.

Spring 864 is preloaded such that when the internal volume of actuator 890 is vented or evacuated (pressure at 1 atmosphere or less) spring 864 maintains the actuator 850 at low, compressed position. Accordingly, pins 372 are maintained below the surface of chuck 364. When the actuator chamber defined by 860, 852 and 854 is pressurized by connecting air pressure through line 832, top flange 860 is actuated by the pressure force to overcome the loading force of spring 864. As the assembly slides up post 862 and linear bearings 868 maintain a precise vertical translation. As a result, pins 372 are actuated to appropriately protrude above the surface of chuck 364. It was empirically found that following the assembly of substrate placement member 850 and positioning pins 372 assembly into sleeves 818 it is useful to actuate the pins slowly up and down between 2-10 times to allow the self alignment mechanism to settle and pivot into an optimized position.

Typically, substrate placement member 850 is actuated with $N_2$ gas to lift the pins up and is evacuated to lower the pins. Evacuation provides additional safety and protection from possible failure of the bellows as it inherently prevents the leakage of potentially hazardous process gas into the ambient. In contrast, bellow failure in traditionally implemented substrate placement members are subject to the potential vacuum integrity breakdown and leakage of hazardous process gas into the factory ambient. This invention also recommends to interlock the three-way valve that commands conduit 832 between pressurized mode and evacuated mode to the pressure in the chamber. This interlock sets the placement member to evacuate mode in case the chamber pressure exceeds a given upper limit to ensure that in the event of bellow failure, wherein the pressurizing nitrogen will flow into the chamber, the system will immediately respond by switching member 850 to evacuation and alert for possible failure. Additionally, it is recommended to attach a small magnet (not shown) at the bottom end of shaft 862 and include 2 magnetic proximity sensors (not shown) on flange 854 to provide indication for correct pins location at up or down positions. Preferably, the electrical wires from the proximity switches are routed outside substrate placement member 850 and the processing system through conduit 832.

C. Modular Perimeter Partition Assembly

Perimeter partitioned chambers are disadvantageously substantially more integrated into the processing system than plane-partitioned chambers. Embodiments for seal-protected PPV and for a compact and chamber contained substrate placement member that were disclosed and illustrated in this invention provide the two essential components for a substantially smaller size modular perimeter partitioned assembly (PPA) which enables substantial portability and modularity. A modular perimeter partition process chamber includes two basic assemblies: a. Lid assembly comprising gas manifolds and process components that are commonly integrated with chamber lids such as gas dispersion members, plasma supporting members, sputtering cathodes, chemical sources, etc.; b. Modular perimeter partitioned assembly comprising the PPV, wafer placement assembly and a variety of processing chamber accessories and downstream components which, having no external chamber walls can only be mounted on the bottom of perimeter partitioned chambers. Preferably, the PPA is portable.

Figure 4A:
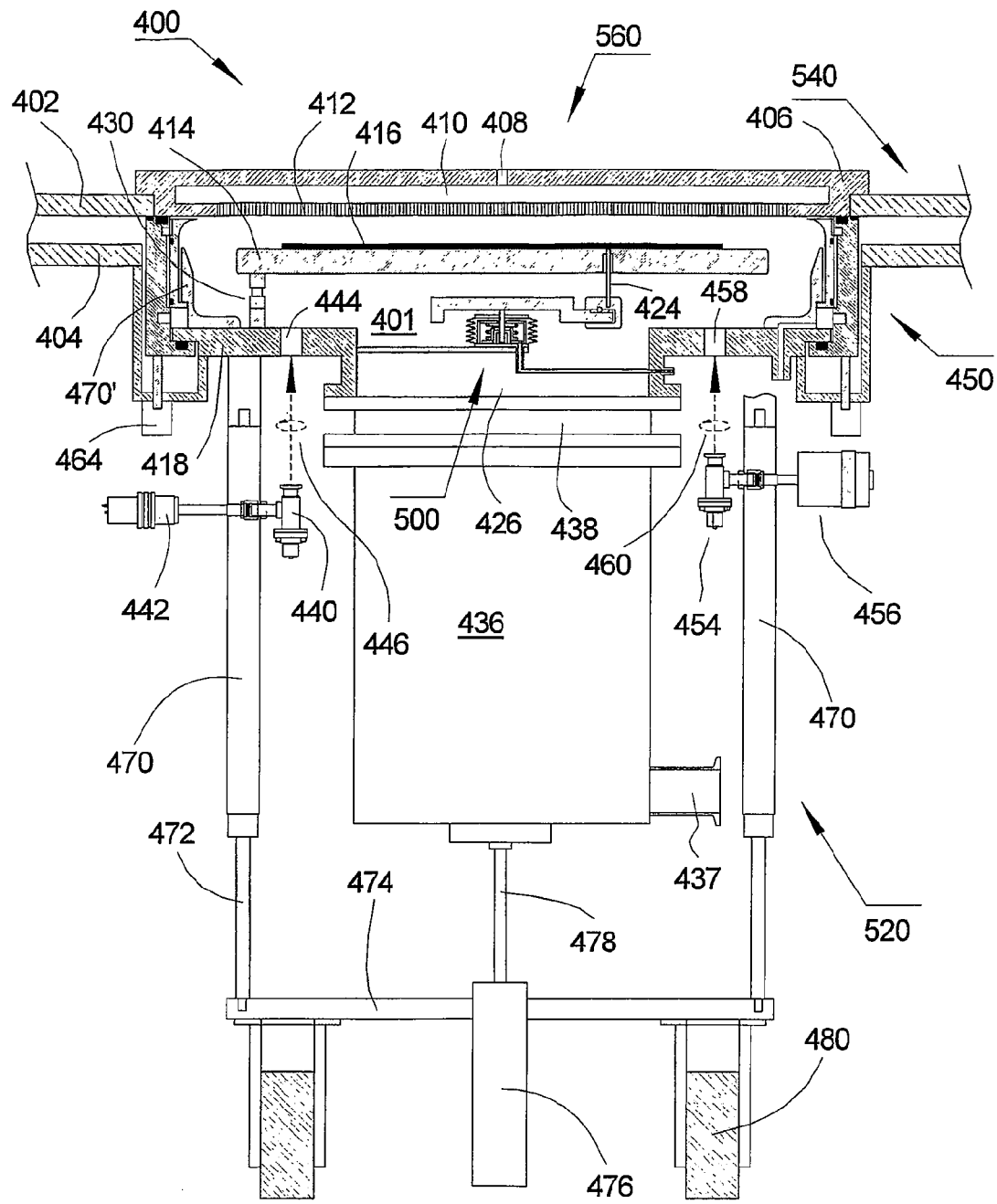
FIG. 4 depicts a perimeter partitioned assembly according to the invention.
Figure 4B:
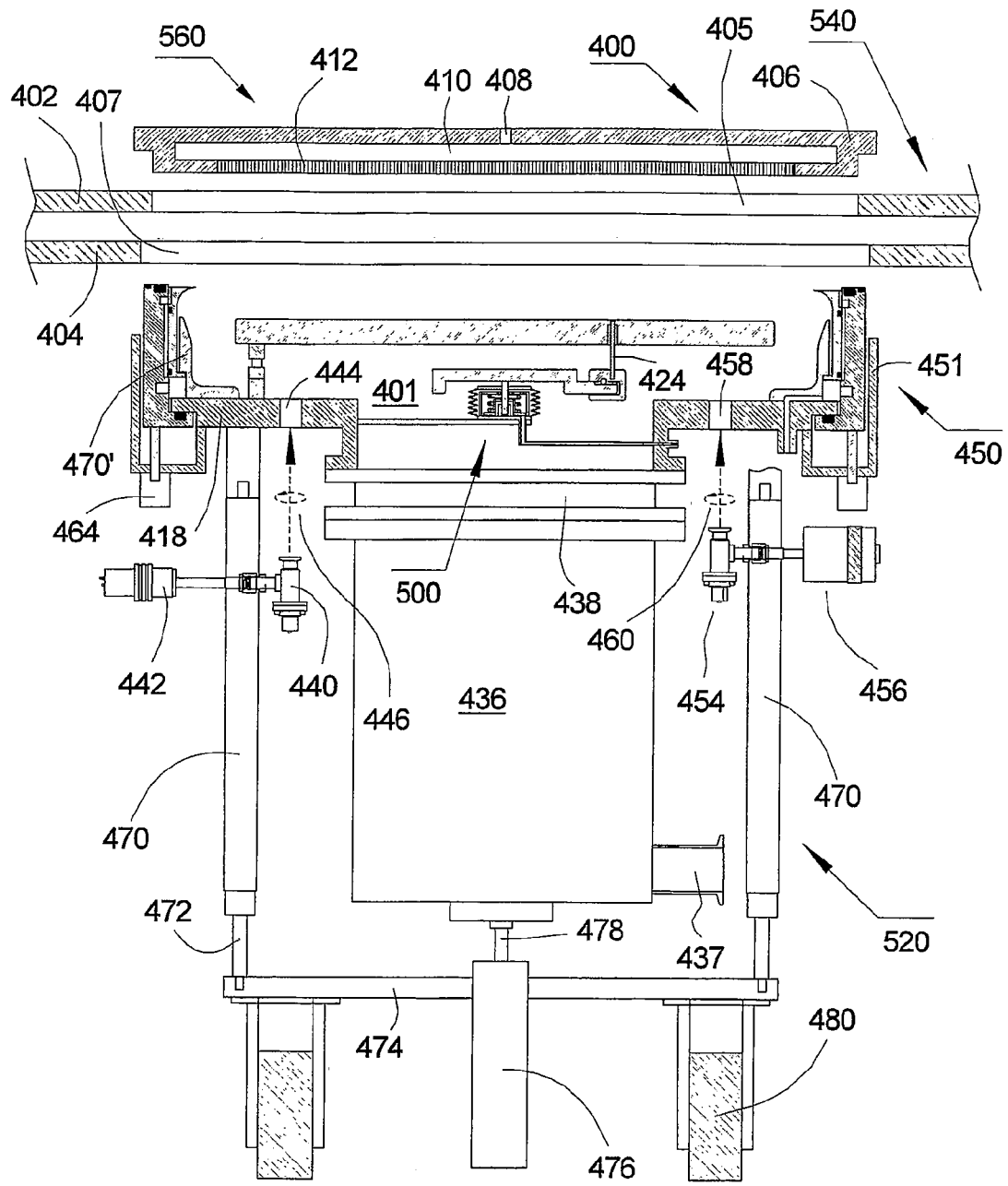
Figure 4C:
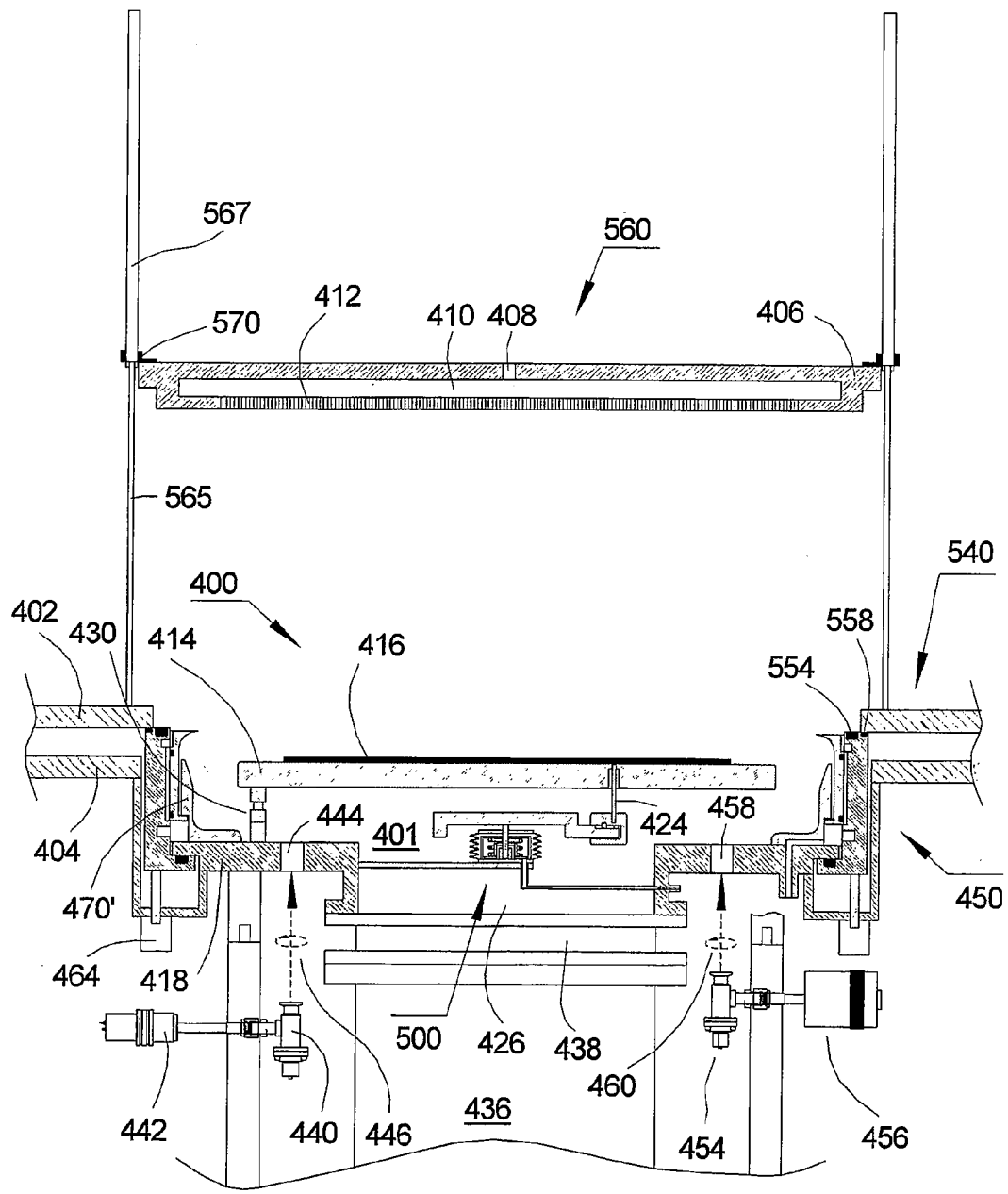

PPA 520 is illustrated in FIGS. 4a, 4b and 4c. The PPA includes a Seal Protected Perimeter Partition Valve (SP3V) 450, a bottom chamber flange 418, Low Profile pneumatic Lift Pins Assembly (LP2A) 480 and exemplary chamber components such as capacitor manometer 456 and cold cathode pressure gauge 442. Pressure gauges 442 and 456 are connected to bottom plate 418 through isolation valves 440 and 454, respectively and ports 444 and 458, respectively. For the sake of illustration the arrows 446 and 460 indicate the assembly positions for valves 440 and 454, respectively. Furthermore, the PPA includes pumping port 426, chamber isolation gate valve and/or throttle valve 438, high vacuum pump 436 (if required for the process), Pneumatic actuator 476 for supporting and translating the high vacuum pump, Pneumatic actuators 470 (typically four) providing vertical PPA positioning, carrier plate 474 and casters 480. Substrate 416 is supported on chuck 414. Chuck 414 is suitably mounted using typically three, equally spaced, posts 430 (only one is shown). Substrate placement member 480 implements a three lift-pins LP2A design (only one pin, 424, is shown). Preferably, the number of posts 430 supporting chuck 414 equals the number of pins 424 and the pins and the posts are placed in a staggered arrangement.

PPA 520 is attached to a suitable port 407 at the bottom 404 of system chamber 540 as illustrated schematically in FIG. 4b. FIG. 4b further illustrates a view of the PPA separated from the system chamber 540. The system chamber includes opening ports that substantially match the shape of the PPVs and provide a good bottom-looking seal surface (not shown) wherein the outer seal of the bonnet 451 of PPV 450 is sealed to port 407 at the bottom 404 of system chamber 540 and lid assembly 560 is sealed to port 405 at the top 402 of system chamber 540. Lid 560 includes inlet 408, gas distribution space 410 and gas distribution dispersion member 412.

Lid assembly 560 is lifted to open the chamber for service using, for example, pneumatic actuators 567, fasteners 570 and pistons 565 (FIG. 4c). At that position the major top perimeter seal 554 of PPV 450 can be serviced, if necessary. The system chamber is maintained isolated from the vented space 401 by the provision of perimeter seal 558. In one preferred embodiment a perimeter partitioned chamber comprise two portable assemblies, PPA 520 and lid 560. As illustrated in FIG. 4b the PPA is conveniently separated from the system chamber by lowering the entire PPA using, for example, pneumatic actuators 470 and 476. The rugged and self-contained PPA is then translated by using, for example, casters 480. With the exception of the lid, the portable PPA 520 comprises the entire chamber. Accordingly, PPA enables substantial system modularity and flexibility.

Figure 5:
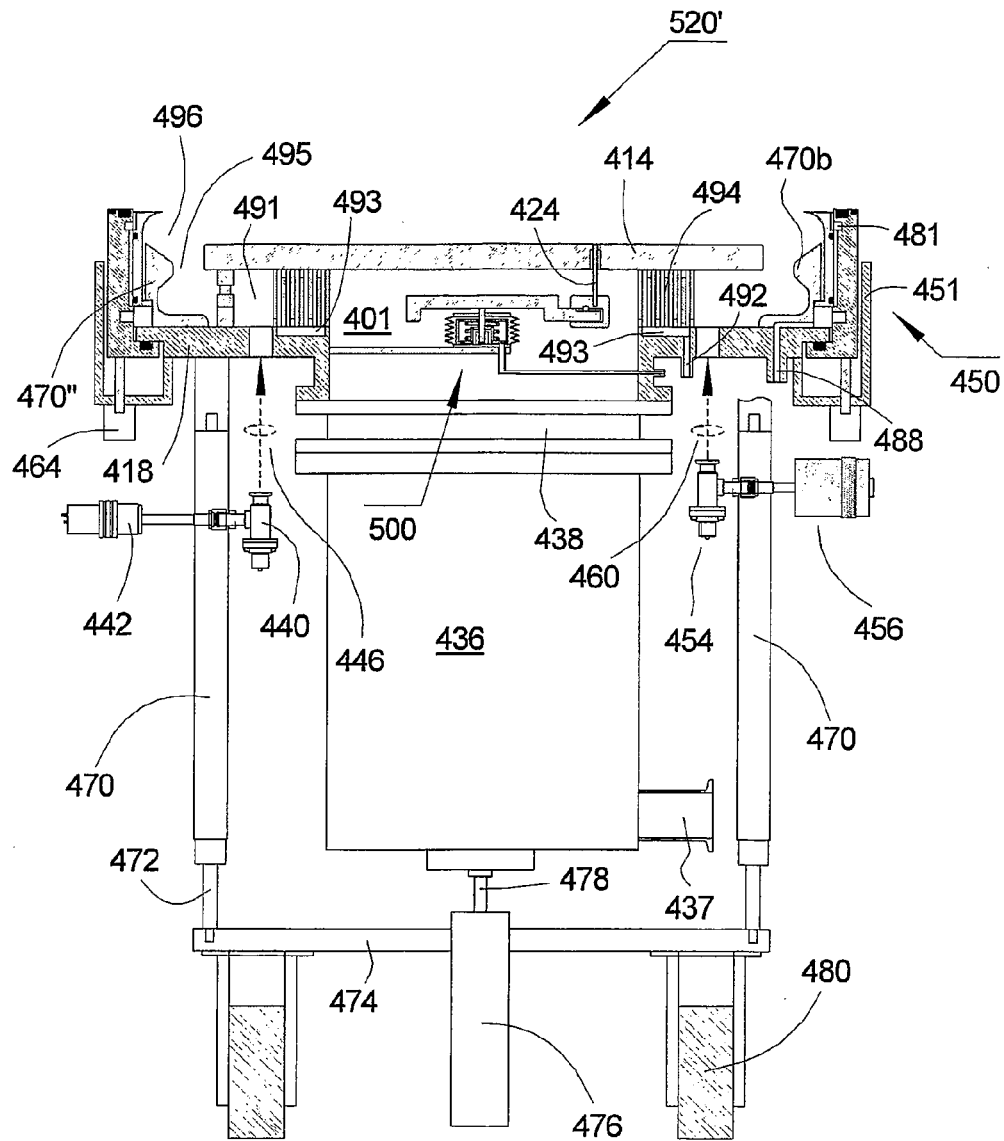
FIG. 5 depicts schematically an ALD perimeter partitioned assembly according to the invention.

PPA implementations of a variety of processing methods preferably share most of the components and preferably maintain a generic size and interchangeable PPA interface at all positions within a processing system. An exceptionally performing PPA based SMFD-ALD chamber for 200 mm wafer size is only 325 mm outer diameter wide. This small PPA is suitable for many other processes such as chemical vapor deposition (CVD), plasma-enhanced chemical vapor deposition (PECVD), reactive ion etching (RIE), photoresist and polymer strip, physical vapor deposition, ion implantation and more. FIG. 5 illustrates schematically a SMFD-ALD PPA. Accordingly, PPA 520' is designed to include a perimeter Draw Control Introduction Chamber (DGIC) compartment 496 that is confined by an upstream perimeter orifice (219 in FIG. 2) that is formed between the bottom of a gas distribution member (not shown) and chuck 414, and a downstream perimeter orifice 495 that is formed between top 470b of stationary liner 470" and chuck 414. Further, a perimeter Integrated Abatement Sub Assembly (IASS) 494 is positioned underneath chuck 414 to define draw control compartment 491 in according with the layout of an SMFD ALD apparatus. Reactive gas inlet 492 provides reactive abatement gas mixture into perimeter gas plenum 493 and further into the IASS space. Draw control gas is introduced according to the SMFD-ALD method through inlet 488 and further through the upper seal protection path 481 (281 in FIG. 2b) of PPV 450 that acts as the draw control gas plenum in directing the draw control gas into DGIC 496. To enable the substantially high draw control gas flow the conductance of capillaries 272 (FIG. 2b) is substantially increased. For example, it is preferred to implement 60 commercially available 4 cm long capillaries with 0.028 inch outer diameter and 0.016 inch inner diameter To form a conductance path of ~0.28 liter/sec when pressurized with 75 Torr and a corresponding ~1650 sccm flow. According to the SMFD-ALD method the flow of draw control gas and reactive abatement gas into DGIC 496 and draw compartment 491, respectively, is synchronized with the ALD cycles and is substantially confined to the ALD chemical dose steps. Also, since reactive gas substantially exists in the process space only during ALD chemical dose steps the PPV seal protection is only needed substantially during the ALD chemical dose steps since during the ALD purge steps the entire volume 401 of the SMFD ALD chamber is purged with inert gas and therefore PPV seal protection flow is not necessary. Further information concerning the SMFD-ALD apparatus layout and method is furnished in US patent application number 2003/0180458.

Figure 6:
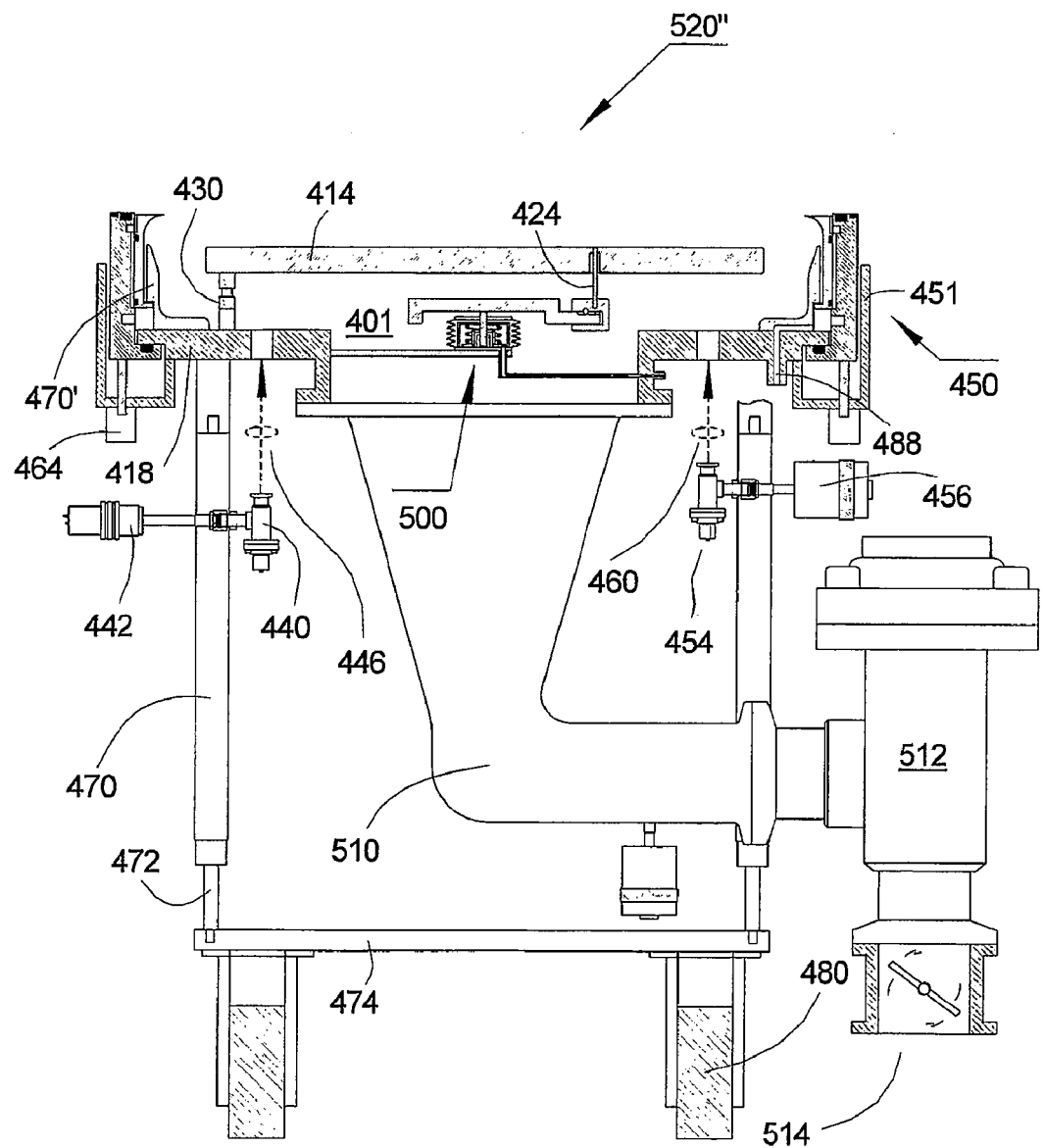
FIG. 6 depicts schematically a PECVD/CVD perimeter partitioned assembly according to the invention.

In another example of the preferred embodiment a PPA suitable for processes such as CVD and PECVD is described in reference to FIG. 6. PPA 520" comprises SP3V 450, LP2A 500, pumping manifold 510, isolation valve 512 and throttle valve 514. Chuck 414 is mounted using posts 430 (only one is shown) as described above. The portable PPA is further mounted on pneumatic actuators 470 (2 out of 4 are shown) and supported by plate 474 and casters 480. The SP3V is continuously purged with inert gas during process as described above in reference to FIG. 2.

D. Low Profile Load Lock Station

Figure 7A:
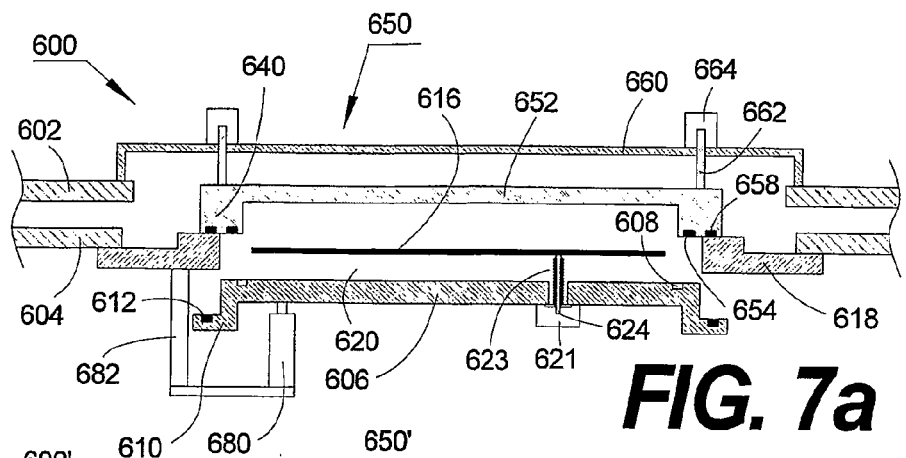
FIG. 7 depicts schematically a perimeter partitioned load-lock chamber according to the invention.
Figure 7B:
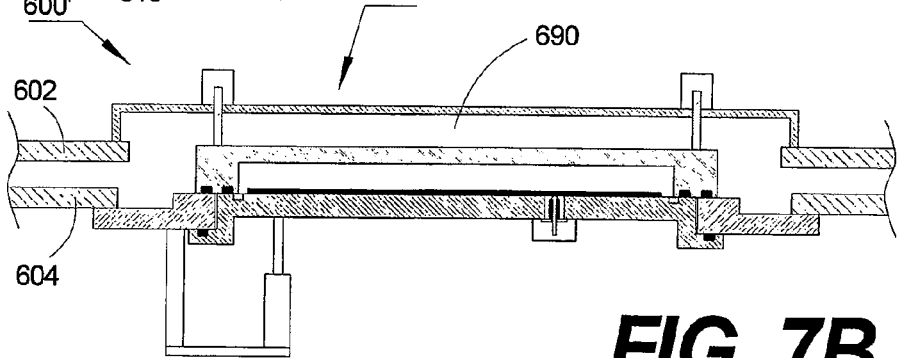

A load lock station 600 comprising a semi-perimeter partition valve (SPPV) 650 is illustrated in FIG. 7a. SPPV 650 includes a dome shaped slide 652, bonnet 660, guides 662 and actuators 664. Furthermore the SPPV includes 2 perimeter seals 654 and 658 which are located at the inner and the outer of seal portion 640. SPPV 650 is mounted over the top 602 of system 600. Bottom adapter plate 618 is mounted at the bottom 604 of system 600. Load-lock door 606 is supported on three pneumatic actuators 680 (only one shown). Pneumatic actuator 680 is mounted to the bottom adapter plate 618 utilizing bracket 682. Pneumatic actuator 680 is actuated to lower door 606 to facilitate substrate transport at ambient pressure as illustrated in FIG. 7a. To facilitate substrate loading, pins 624 (one out of three is shown) are employed to elevate the substrate and create a gap 620. Substrate transport member is then inserted into gap 620. Subsequently pins 624 are actuated to the lower position and the substrate is left on the substrate-handling member. To facilitate substrate unload substrate 616 is elevated by pins 624 to create gap 620. Following, the substrate-handling member (not shown) is inserted into gap 620. Then pins 624 are lowered and the substrate is left on the handling member. Lift-pins 624 are used for substrate placement at the load-lock station 600 wherein the pins are sealed from the ambient by bellows 623 and are actuated by actuators 621. Load-lock door 606 preferably includes a Teflon ring 608 that substantially eliminates the gap between slide 652 and door 606 when door 606 is at the upper sealed position as illustrated in FIG. 7b. The volume 690 of the sealed load-lock chamber is extremely small. For example, the volume of a 200 mm wafer size load-lock is preferably less than 500 cc.

When door 606 is elevated to the shut position a seal is created between the top surface 614 of door 606 and perimeter seal 654. Additionally, door 606 is also sealed to bottom adapter plate 618 at lip 610.

Following load-lock 650" evacuation, dome SPPV 652 is actuated to the open position and substrate placement on -the handling member is facilitated by lifting substrate 616 over pins 624 positioning substrate handling member underneath the substrate, lowering pins 624 to place the substrate on the handling member and subsequently translating the substrate.

E. Processing System with Reduced Footprint

Figure 7C:
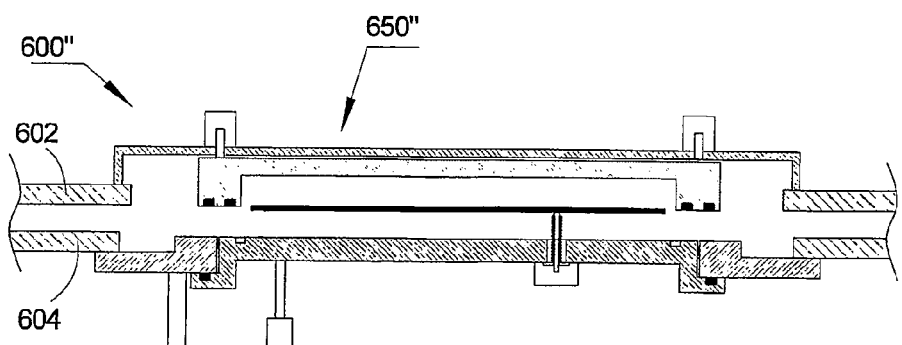
Figure 8:
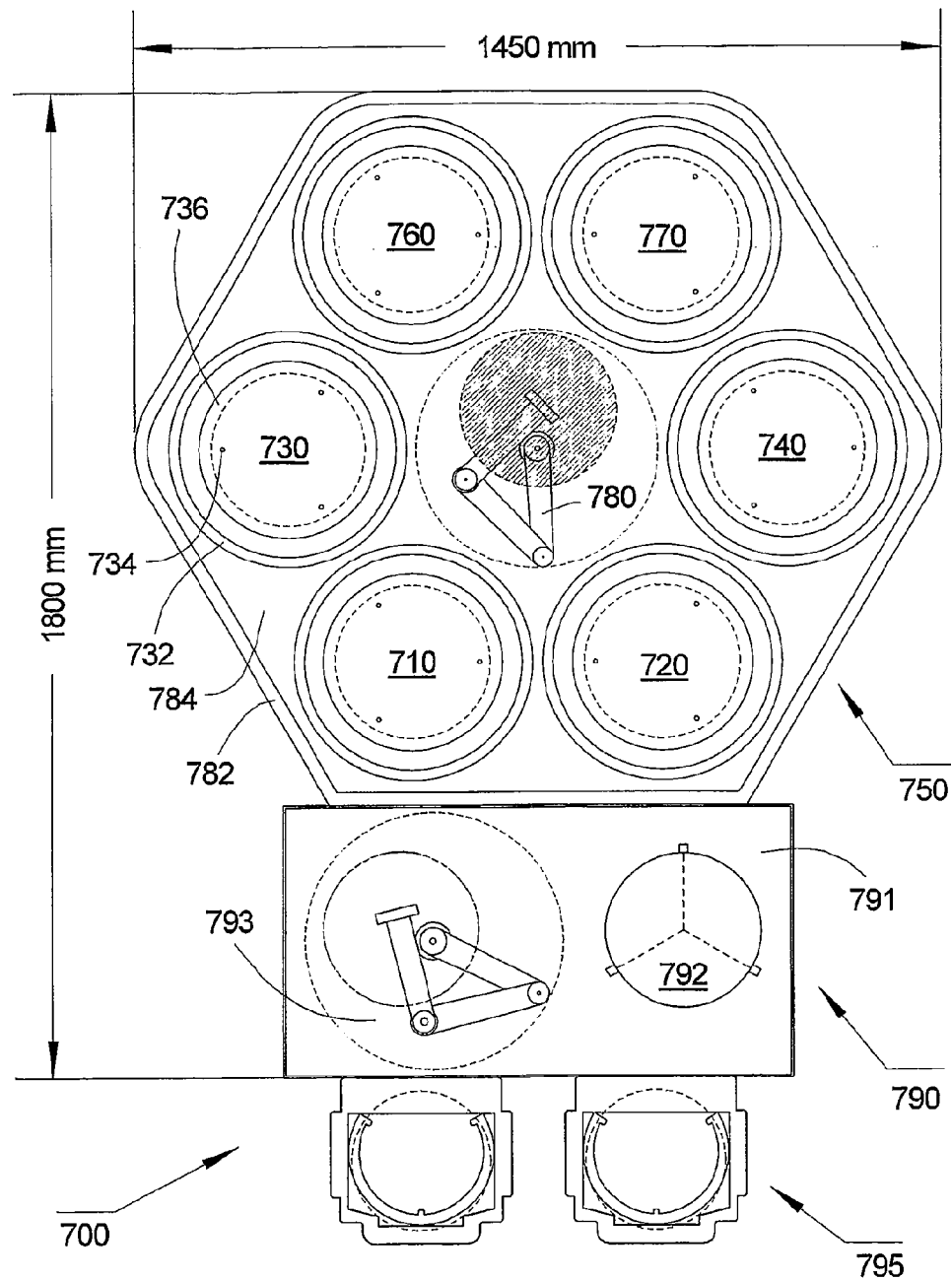
FIG. 8 depicts schematically a top view of a PPA based modular processing system according to the invention

Seal protected perimeter partitioned processing systems enable efficient system area utilization yielding remarkably small system footprint. For example, FIG. 8 illustrates schematically a top overview of processing system 700 for the processing of 300 mm round wafers. System 700 comprises system chamber 750, equipment front-end module (EFEM) 790 and several front opening unified pod (FOUP) 795 as conventionally practiced in the art of semiconductor processing. The system chamber in the example of FIG. 8 includes 6 PPAs which are preferably occupied by 2 load-lock stations 710 and 720 and 4 process stations 730, 740, 760 and 770. Load-lock stations are, for example, similar to the PPA apparatus that was described in reference to FIGS. 7a, 7b and 7c. PPA process stations are, for example, SMFD-ALD process stations, similar to the PPA apparatus that was described in reference to FIG. 5. System chamber 750 further comprises robot 780 and system chamber wall 782. Wall 782 defines the system chamber space 784. System chamber 784 further includes means for pumping and venting (not shown), pressure gauges (not shown) and other accessories that are commonly implemented within substrate transport chambers as well-known to those who are skilled in the art. EFEM 790 includes wafer alignment 792 and atmospheric robot 793, as well as controlled environment space 791 and other components that are commonly practiced in the art. For example EFEM 790 substantially utilizes commercially available subsystems such as the Plus Portal XT available from Asyst Technologies or the FX series available from Brooks Automation.

The process stations comprise SP3V 732, 3 pins LP2A 734 and chuck 736 among other components, as depicted schematically in FIG. 8, with an outer diameter of 425 mm. The total area of the system is commonly taken without the area that is occupied by the FOUP to be $1800 \times 1450$ mm$^2 \approx 28$ square foot (sqft). This footprint is remarkably smaller than the footprint of prior art systems. For example the area occupied by a 4 process chambers system based on the commercially available Gemini Express GX 6000 manufactured by Brooks Automation is $3108 \times 3120$ mm$^2 \approx 104$ sqft. Even minibatch systems such as the Vector (Novellus Systems), the Aspen3 (Mattson Technology) and the Producer-S (Applied Materials) occupy substantially larger footprint for a 4 chambers system at 43, 57 and 58 sqft. respectively.

System 700 preserved maximum flexibility of substrate handling and sequencing in similarity to the modular and flexible processing systems known in the art as "cluster tools." Modularity and system flexibility is enabled by the combination of portable PPA and lid as described above. Processing stations can be covered with blank flanges to allow for future expansion of system throughput by exchanging blank flanges with PPA and lid assembly combinations. Similar to the "bolt-on" chamber approach that is currently practiced in the art of semiconductors and other device manufacturing.

F. The Revolution Processing System

Figure 9:
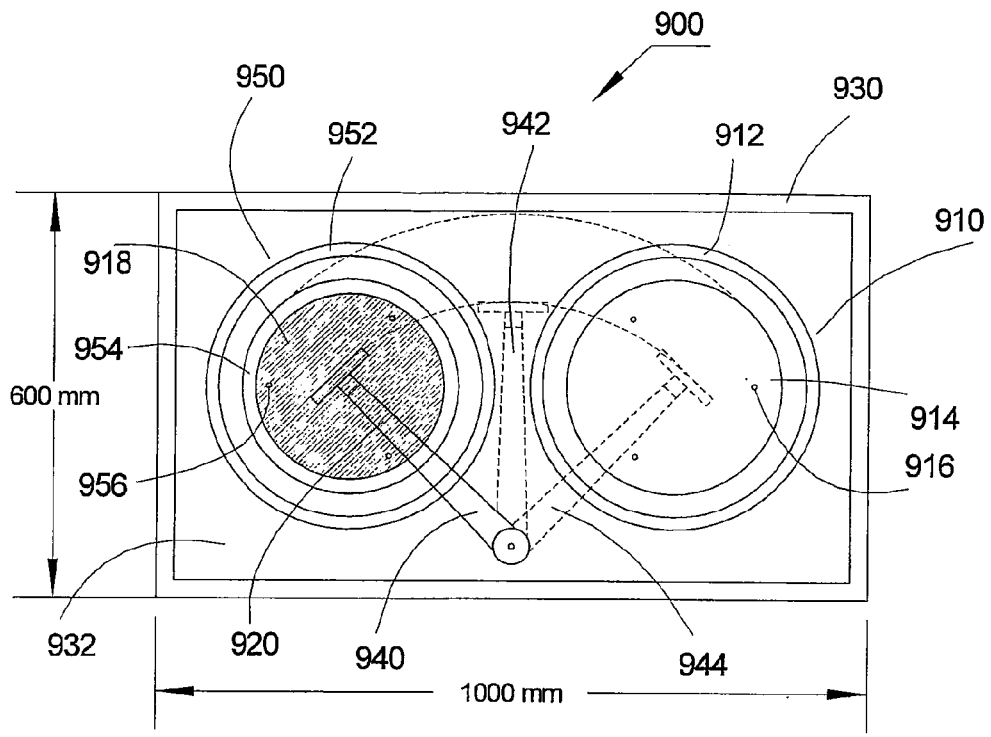
FIG. 9 depicts schematically a top view of a PPA based simple processing system having one process PPA and one load-lock PPA according to the invention

Perimeter partitioned systems enable 360° substrate accessibility. This unique accessibility enables substrate transport apparatuses and methods that advantageously reduce system complexity, system size, or both. In particular, rotating levers can be implemented to revolve substrates from one PPA to another while occupying a significantly small area within the process system space. Accordingly, a simple deposition system is illustrated in FIG. 9. System 900 includes load-lock PPA 950 and process PPA 910 and is set for processing 300 mm round wafers. Wafers are loaded in load-lock PPA 950 by suitable means known to those who are skilled in the art, such as EFEM 790 described in reference to FIG. 8.

Following loading the load-lock PPA is sealed and evacuated according to the procedure described above in reference to FIGS. 7a, 7b and 7c. Wafer 918 is then lifted by a three-pins assembly 956 to form a substantial gap underneath the wafer. Then PPV 952 is actuated "OPEN". The revolution lever 920 is rotated counterclockwise from position 942 to position 940 where it is located under the wafer. For example position 942 is parallel to the short axis of system 900 and is designated 0°, and position 940 is located 45° counterclockwise and is designated −45°. The orientation of pins 956 is preferably selected to be −44°; 76° and 196° to accommodate revolution lever positioning under the center of wafer 918. Following, lift pins 956 are lowered and the wafer is placed on revolution lever 920. SP3V 912 is actuated "OPEN" and the revolution lever rotates 90° clockwise to position the wafer at location 944 above the center of process PPA 910. Lift pins 916, preferably located at −76°; 44° and 164° are elevated to lift wafer 918 off the revolution lever 920. Revolution lever 920 is rotated 45° counterclockwise to position 942 and both SP3V 912 and PPV 952 are actuated "SHUT" while the wafer is placed on chuck 914 by lowering pins 916. Following wafer 918 is processed. When processing is complete, wafer 918 is translated back to load-lock 950 following the reversal of the procedure described above for wafer loading. Although the arrangement of system 900 is inefficient with the 1:1 ratio of load-lock chambers to process chambers, a 600×1000 mm²≈6.5 sqft. footprint (without an EFEM) is attractive for R&D applications wherein manual wafer' placement into PPA 950 is practiced. Other configurations such as sharing a single 2 FOUP EFEM between 2 systems 900 yield highly flexible systems with advantageously small footprint, i.e. ~18.5 sqft. For a 2 process chamber system.

Figure 10A:
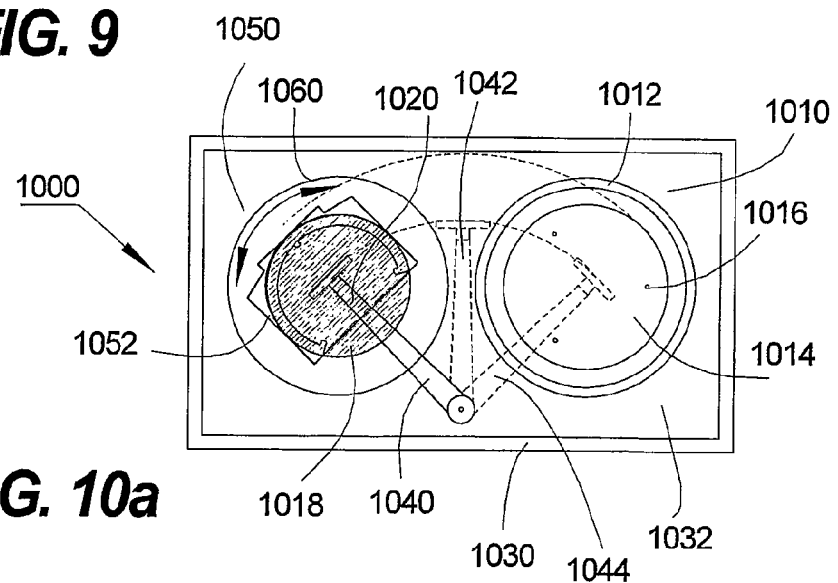
FIG. 10 depicts schematically a top view of a PPA based simple processing system having one process PPA and a cassette load-lock according to the invention
Figure 10B:
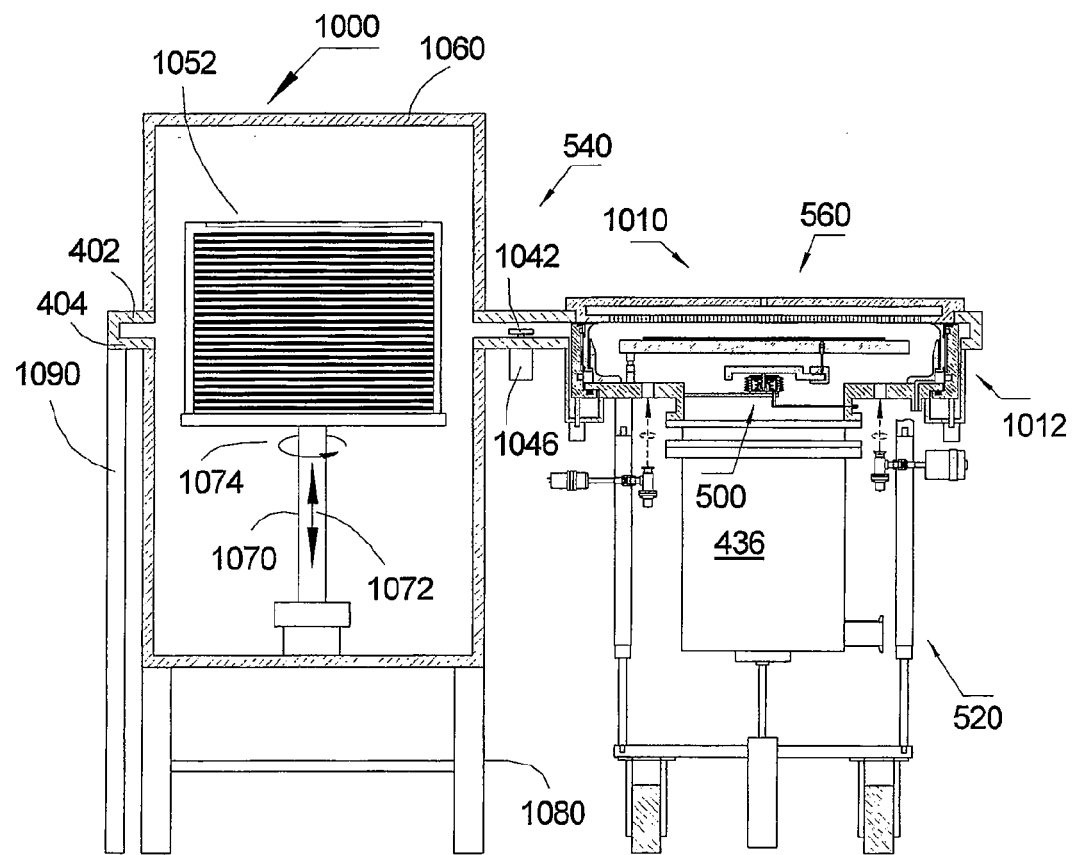

In another modification system 1000 illustrated in FIGS. 10a and 10b implements a cassette elevator 1070 within the system chamber space 1032 to support and position a wafer cassette. The elevator includes elevation 1072 and rotation 1074. Preferably the entire space of system chamber 1000 serves as the load lock chamber. Prior to system venting the SP3V 1012 is actuated "SHUT" and revolution lever 1020 is located at position 1042. Following cassette 1052 loading. The system chamber space 1032 is evacuated and the cassette elevator height is adjusted to position the selected wafer slightly above the plane of rotation of revolution lever 1020. Cassette elevator 1070 is rotated to place the opening of cassette 1052 at 90°. Then revolution lever 1020 is rotated 45° counterclockwise while cassette elevator 1070 is synchronously rotating clockwise until the opening of cassette 1052 reaches 135° and concurrently the revolution lever has reached −45° and the revolution lever is placed within the cassette underneath the selected wafer as practiced in the art. Following the cassette elevator lowers cassette 1052 to leave the selected wafer on the revolution lever. Then the revolution lever rotates clockwise to 0° (position 1042) while concurrently and synchronously the cassette elevator rotates the opening of cassette 1052 to 90°. Then SP3V 1012 is actuated "OPEN" and the revolution lever rotates clockwise to position 1044 at 45° wherein the wafer is positioned above the center of chuck 1014. Following, lift pins 1016 are elevated to pickup the wafer from the revolution lever. The revolution lever is then rotated counterclockwise to position 1042, SP3V 1012 is actuated "SHUT" and the wafer is placed on chuck 1014 by lowering pins 1016. The loaded wafer is processed within PSA 1010. Following process completion the wafer is downloaded back to the cassette in a reversal manner to the method described above. FIG. 10b further illustrates the cassette load-lock chamber comprising enclosure 1060 and mounting frame 1080. Also illustrated schematically is part of the system chamber support frame 1090. Revolution lever 1020 is shown at position 1042. Also illustrated rotational stage 1046. A schematic representation of process chamber generally follows the embodiment that was described in reference to FIG. 4a. The footprint of system 1000 is extremely small at 460×775 mm²≈3.8 sqft., 400×650 mm²≈2.8 sqft. and 320×530 mm²≈1.8 sqft. for a 200 mm, 150 mm and 100 mm wafer size, respectively. These systems represent a very efficient utilization of space for small scale or mini-fab production.

Figure 11:
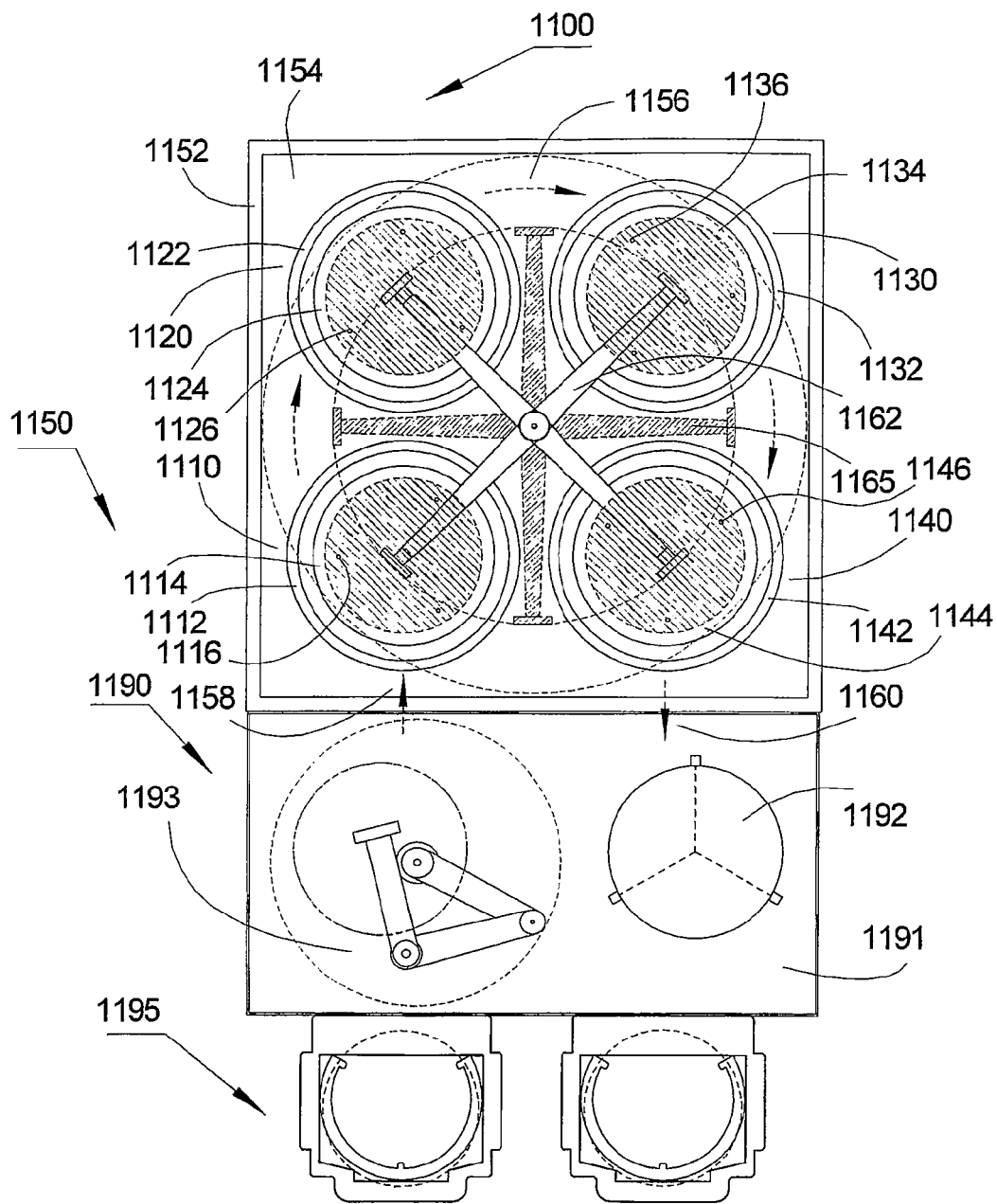
FIG. 11 depicts schematically a top view of a sequential Revolution process system according to the invention

Revolution type wafer handling is suitable for multiple process chamber systems. For example b 300 mm round substrate processing system 1100 illustrated in FIG. 11. The system includes wafer supply within FOUPs 1195. The wafers are handled by EFEM 1190 comprising a controlled environment space 1191, a wafer alignment member 1192 and an atmospheric robot 1193. The system chamber 1150 includes 4 PPAs 1110, 1120, 1130 and 1140. In a specific preferred embodiment PPAs 1110 and 1140 are load-lock stations comprising PPV 1112 and 1142 and lift-pins 1116 and 1146, respectively. Process PPA 1120 is used to grow a copper barrier layer, such as Ruthenium using ALD and process PPA 1130 is used to grow a copper seed layer using ALD. PPAs 1120 and 1130 comprise SP3Vs 1122 and 1132, chucks 1124 and 1134 and lift-pins 1126 and 1136, respectively. Wafer processing follows the sequence of loading a fresh wafer into load-lock 1110 and removing a complete wafer from load-lock 1140 during processing. Following the load-lock chambers are evacuated. When processing is complete the load-lock chambers are already evacuated. Then all 4 PPVs are actuated "OPEN". At that point PPA 1110 includes a fresh wafer, PPA 1120 includes a wafer with a copper barrier layer and the wafer in PPA 1130 has the complete stack of copper barrier seed layers. PPA 1140 is empty. The wafers are lifted by the pins to clear gaps between the wafers and the chucks and subsequently the revolution cross rotates clockwise from position 1165 to position 1162. The wafers are placed on the revolution cross end-effectors by lowering the pins. Following the revolution cross advances 90° clockwise to a new position 1162. The lift pins are elevated to pick up the wafers. Then the revolution cross rotates 45° counterclockwise to position 1165. Following the wafers are placed on the respective chucks by lowering the pins and the PPVs are actuated "SHUT". Next the wafers are processed within PPAs 1120 and 1130 while concurrently load-lock PPAs 1110 and 1140 are vented, the complete wafer is removed from PPA 1140 and placed in the FOUP and a fresh wafer is loaded from the FOUP into load-lock 1110. Finally, the load-lock PPAs are evacuated. When the processing is complete the sequence is repeated. Arrows 1158, 1156 and 1160 represent the direction of wafer revolution from start to finish.

Alternatively, system 1100 preferably includes only one load-lock PPA 1110 and three process PPAs. In this configuration wafers are processed either sequentially to grow films in three separate portions or processed integrally to grow advantageous stacks of films. For example, a 300 nm thick encapsulating $Al_2O_3$ layer is split into three consecutive 100 nm deposition processes performed sequentially at 1120, 1130 and 1140 process PPAs. Alternatively, a stack of metal-insulator-metal (MIM) films is grown within system 1100 wherein the dielectric is grown within PPA 1130 and the metal layers are grown within PPAs 1120 and 1140.

G. Sequential Deposition Chambers

Figure 12:
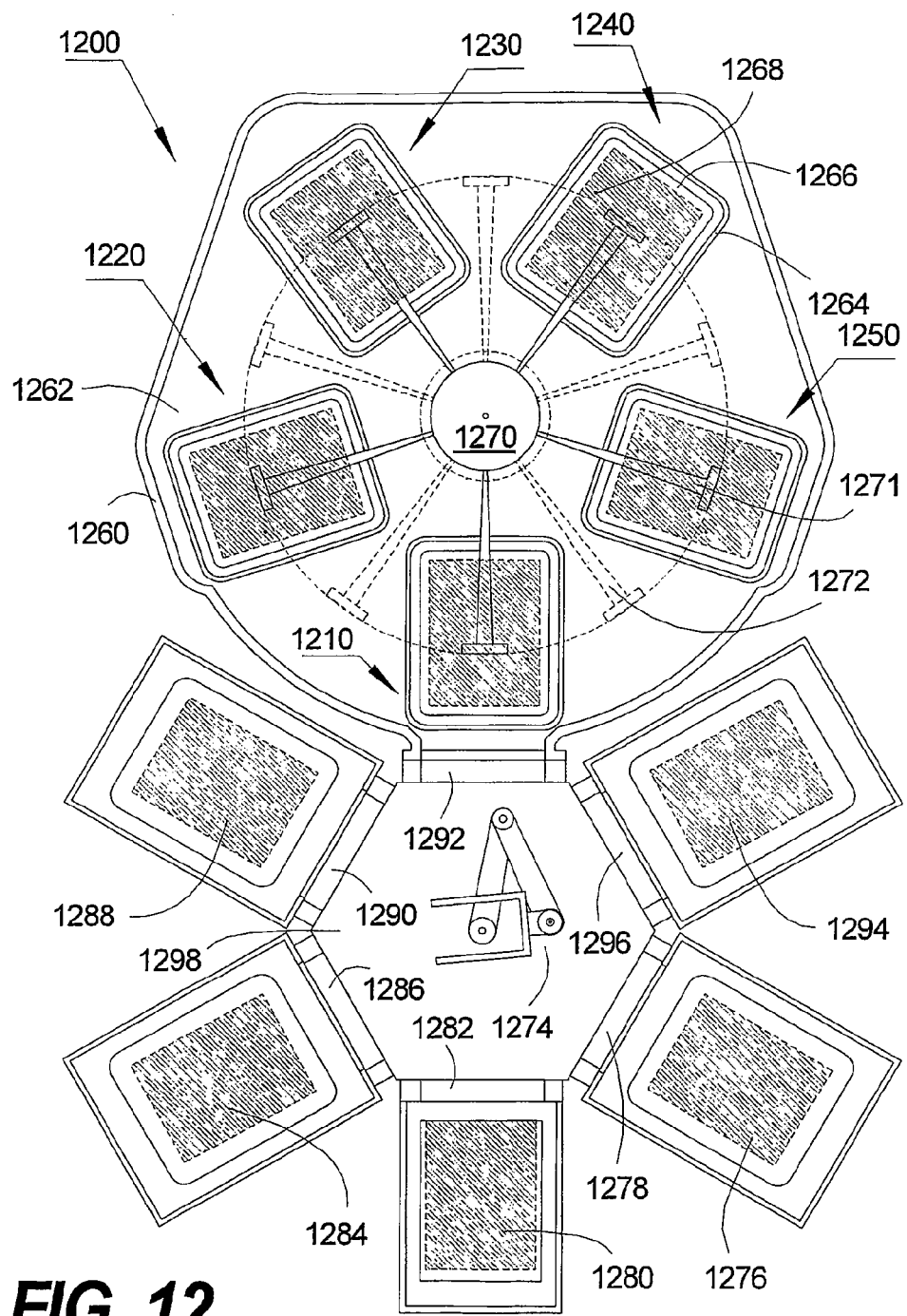
FIG. 12 depicts schematically a top view of a process system with a PPA based sequential deposition chamber according to the invention

Integrated sequential processing is commonly implemented in organic light emitting diode (OLED) fabrication technology. Integrated processing requires similar processing time within the various steps in the integrated sequence. This requirement is not necessary commensurate with the performance of sometimes vastly different process steps. Accordingly, the throughput of sequential processes may tag the throughput of the slowest process. Sequential deposition chambers based on PPAs and revolution wafer handling are suitable to combine within an integrated processing system to enhance the throughput of an otherwise slow process to match the pace of the system. For example, FIG. 12 illustrates a flat panel display processing system 1200. System 1200 comprises a central substrate handling chamber 1298, a load-lock 1280 loaded with a cassette of rectangular substrates, 4 conventional processing chambers 1276, 1284, 1288 and 1294 and a sequential deposition chamber 1260. Also included is robot 1274 and planar slit valves 1282, 1278, 1290, 1296 and 1292 positioned to gate the access into load-lock 1280 and chambers 1276, 1284, 1288, 1294 and 1260, respectively. Substrate processing follows a sequence such as 1276, 1284, 1294, 1288, 1260 and the processing time within each chamber is 3:30 minutes. Substrate handling is accomplished within 30 seconds. Accordingly, the system produces a complete substrate every 4 minutes. Chamber 1260 includes 5 deposition PPAs. Each deposition PPA deposits ⅕ of the thickness within the 3:30 minutes timing of the system. Fully deposited substrates are transported from PPA 1210 of chamber 1260 back into cassette 1280. Substrates are passed from chamber 1294 into PPA 1210 within chamber 1260 and are revolved immediately to PPA 1220. That revolution includes also the translation of substrates one chamber clockwise. Accordingly, prior to the start of the deposition, the substrate within PPA 1210 is the substrate that has completed the deposition of ⅘ of the film and was just transferred from PPA 1250. Following the completion of a 3:30 minutes process interval the robot 1274 removes the substrate from PPA 1210 and places it in the cassette. Then the robot removes the substrate from chamber 1294 and places it on PPA 1210. Following, the substrates within process chamber 1260 are revolved clockwise for subsequent processing while the robot continues to move the substrates forward to the next chambers in the sequence.

Processing system 1200 represents a specific example wherein the processing time of one of the processes in the sequence is substantially five times longer than the typical processing time. Likewise PPA based process chambers with different numbers of process PPAs are implemented as well as systems with more than one of the multi-PPA chamber to optimize the efficiency of integrated sequential processing by substantially match the processing time of all the process steps in the sequence.

H. Dual PPA Process Chambers

Figure 13:
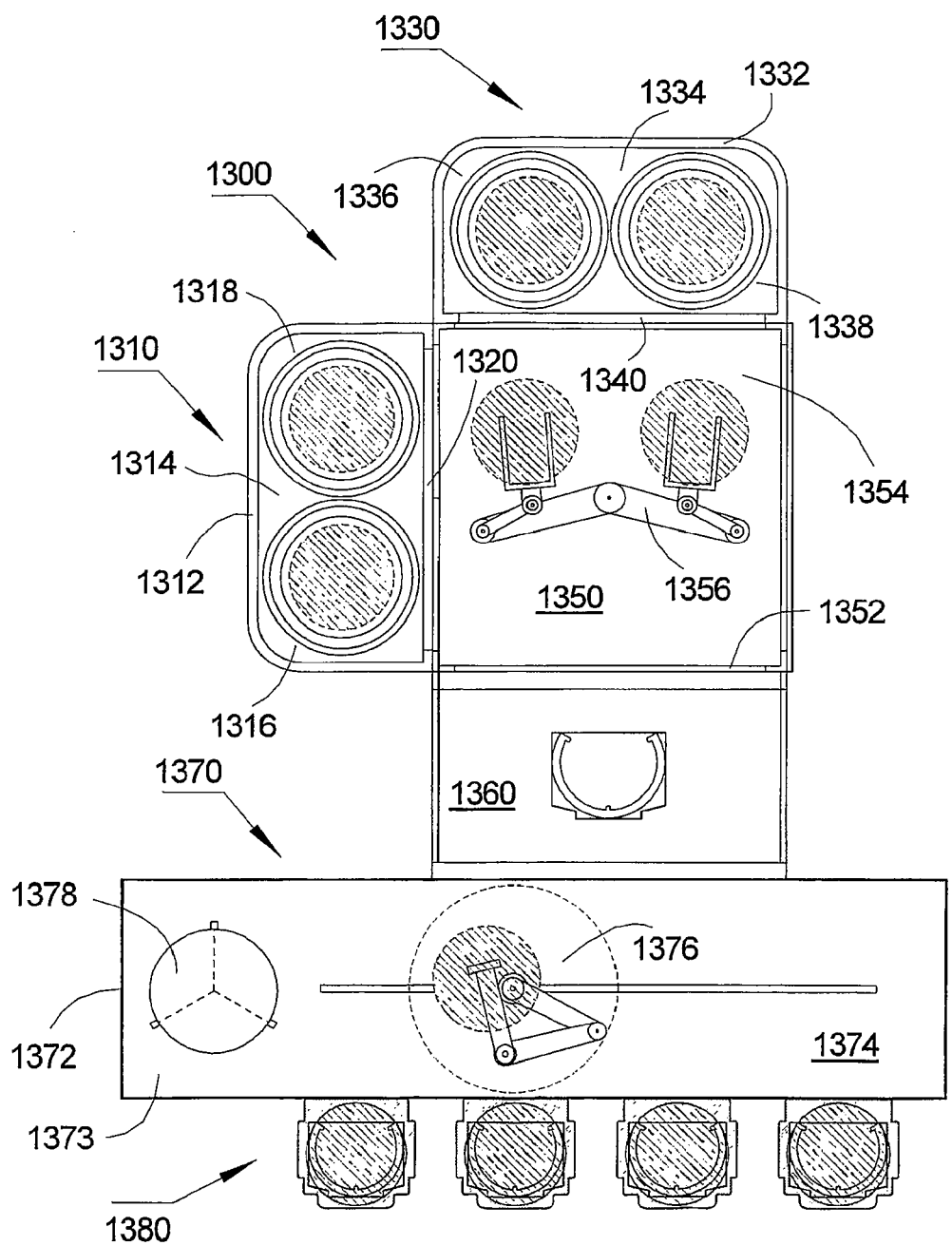
FIG. 13 depicts schematically a top view of a PPA based retrofit of dual station chambers into single wafer chambers according to the invention

FIG. 13 illustrates a preferred embodiment 1300 wherein a processing system with dual station chambers such as the Aspen3 from Mattson Technology or the Producer S from Applied Materials is retrofitted into single wafer process chambers utilizing 2 PPAs per dual station chamber. Accordingly system 1300 includes FOUP 1380, EFEM 1370, Load-lock 1360, transport chamber 1350, dual chamber 1310 and dual chamber 1330. Accordingly, PPAs 1316 and 1318 are mounted within dual chamber 1310 and PPAs 1336 and 1338 are mounted within dual chamber 1330. In the example of FIG. 13 the planar slit valves between transport chamber 1350 and dual chambers 1310 and 1330 were eliminated. Wafer loading is accomplished by actuating both PPAs within a dual chamber "OPEN" and translating wafers using dual end-effector robot 1356. Also illustrated are components within EFEM 1370 such as environmentally controlled space 1373, wafer alignment stage 1378 and atmospheric robot 1376. The embodiment 1300 provides a useful implementation of a medium size footprint and a lower cost equipment, while at the same time performance is maintained.

I. Compact Inline Apparatus

Figure 14:
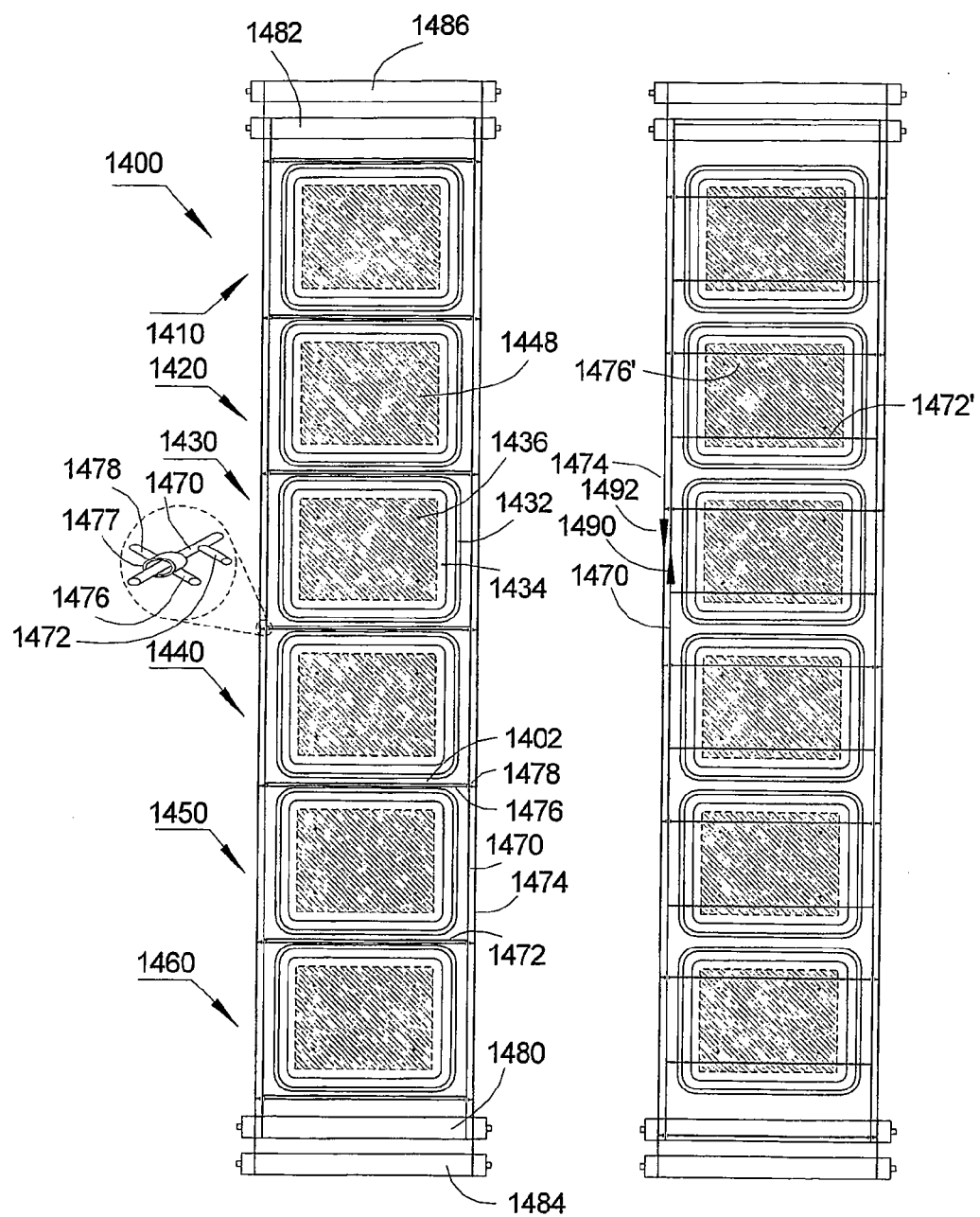
FIG. 14 depicts schematically a top view of a PPA based inline processing system with a timing belt based substrate transport according to the invention.

FIG. 12 clearly indicates the inefficiency of packing rectangular PPAs within a circle. Accordingly the footprint of a 5 PPA sequential process chamber 1260 (for 300×400 $mm^2$ substrates) is 1800×1900 $mm^2 \approx 37$ sqft. and a system footprint of 3300×2250 $mm^2 \approx 80$ sqft. In an alternative approach of system 1400 the rectangular PPAs are arranged in a linear inline configuration creating, for example, a six PPA system as illustrated in FIG. 14a. System 1400 has a footprint of 3500×800 $mm^2 \approx 30$ sqft. To replace system 1200 (FIG. 12) an 11 PPA system (not shown) implements 1 inlet load-lock PPA, 9 processing PPA and one exit load-lock PPA at a total footprint of 5500×800 $mm^2 \approx 47$ sqft.

In the example of FIG. 14a PPA 1410, 1420, 1430, 1440, 1450 and 1460 are mounted within a linear system chamber. Each PSA is equipped with a SP3V, a chuck and a set of 4 lift-pins. Wafer translation between the PPAs is accomplished by lifting the wafers on the pins. Substrate transport member includes 4 timing belt wires, 1470, 1470', 1474 and 1474', tensioned between roller pulleys 1480, 1482, 1484 and 1486. These wires are cross-linked with short sections of lever wires 1472 and 1476 that extend substantially vertically from 1470 to 1470' and from 1474 to 1474', respectively. All the wires are located substantially at the same plane wherein cross-linking wires 1476 from timing belt wires 1474 to wire 1474' connect to rings 1477 which overlap wires 1470 and 1470' as shown in the inset of FIG. 14a. The rings 1477 allow all wires to be substantially at the same plane. The substrates are transported sequentially and the processing sequence is defined as going forward from 1410 to 1460. Once the SP3V are actuated "OPEN" and the substrates are lifted on the pins, wires 1470 and 1470' are rolled in the direction 1490 illustrated in FIG. 14b to position cross wires 1472 under the substrates that are behind their initial place 1402, in the sequence, as illustrated in FIG. 14b. Concurrently, wires 1474 and 1474' are independently rolled in the direction 1492 designated in FIG. 14b to place cross wires 1476 under the substrates that are ahead of them. Then the lift pins are lowered placing the substrates on cross wires 1472 and 1476. Following, all the wires are rotated at the 1492 direction moving the substrate from one PPA forward to the next one. Once the substrates are positioned appropriately above the center of the PPAs the lift pins are elevated to pickup the substrates. Following, the timing belt wires 1470, 1470', 1474 and 1474' are translated at the 1490 direction to clear the gap under the substrates. The cross wires are finally arranged to substantially reside in the narrow gap 1402 between subsequent PPAs and the SP3Vs are actuated "SHUT" in preparation to run process.

Figure 15:
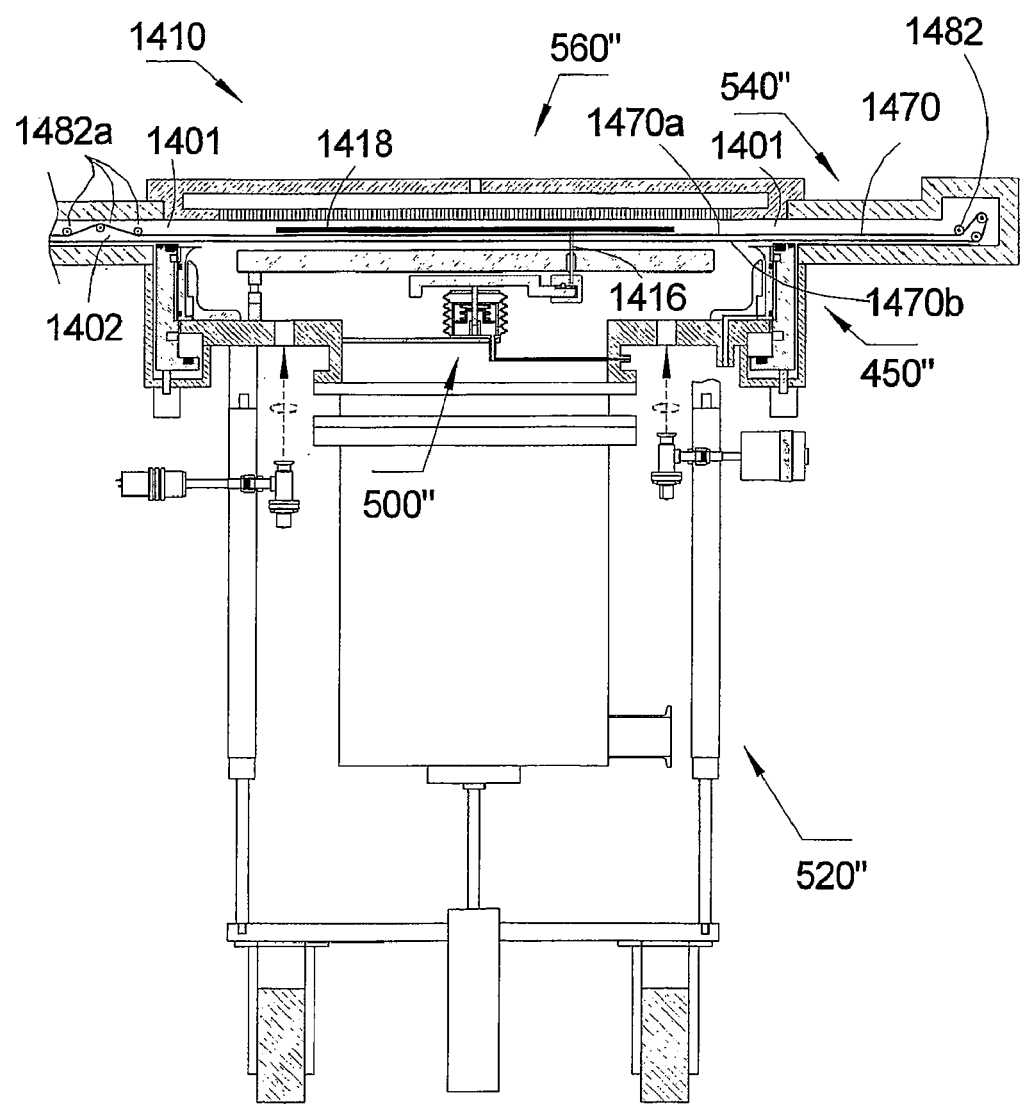
FIG. 15 depicts schematically a cross sectional view of a PPA based inline processing system with a timing belt based substrate transport according to the invention.

In another view FIG. 15 further illustrates the end portion of system 1400 showing PPA 1410 and the end of system chamber 540" wherein the wires, for example 1470, are running outside of the PPAs in parallel to the short dimensions of the rectangular PPAs within system chamber 540" and parallel to the inline of PPAs arrangement. The end of system chamber 1400, 560'", accommodates as set of roller pulleys 1482 that retains the wire at the appropriate tension and provides for reversing the direction of the wire. Only the top portion 1470a is used to translate the wafers and the bottom portion 1470b, preferably spaced less that 2.5 mm under top portion 1470a is used to return the wire and provide a closed timing belt between the pulleys, or pulley clusters) 1482 and 1484 (not shown). The pulleys are arranged such that when the cross wires at the top 1470a are located between the PPAs at positions 1402 the cross wires at the bottom portion 1470b are also located within spaces 1402 and substantially underneath the cross wires on the top portion.

Those who are skilled in the art understand that wafer transport using sets of tensed timing belts wires and cross wires, as described in reference to FIGS. 14a, 14b and 15 advantageously exploit the 360° wafer accessibility of PPAs and are suitable to transport many differently shaped substrates within systems with many different shapes of PPVs and PPV arrangements. In particular, round substrates are also suitable for handling with cross wires devices. Wires and pulleys can be made from many different suitable materials such as metals, polymers or elastomers. The thickness of timing belt wires 1470, 1470', 1474 and 1474' is selected to optimize the mechanical strength. Additionally, ribbons are suitable for 1470, 1470', 1474 and 1474', as well. Cross-wires or cross-ribbons 1472 and 1476 are selected to provide mechanical strength while maintaining a substantially thin profile that is suitable for substrate handling within the relatively narrow clearance 1401 (FIG. 15) between lid assembly 560" and the top of the open SP3V 450". Additional supporting and tensioning pulleys, such as the set of 3 pulleys 1482a illustrated in FIG. 15, are useful to place within the system chamber to maintain the planarity of the cross wires, for example within the sides of spaces 1402 (FIGS. 14a, 15). In the preferred embodiment, one roller pulley per each wire loop, for example 1482 in FIG. 15, is used to drive the wire with preferably a stepper motor. Additional precision is preferably provided using encoders such as optical encoders as commonly practiced in the art of precision positioning.

Systems, apparatuses, and methods designed and operated in accordance with the invention are particularly useful in ALD technology. Perimeter valve technology with seal protected perimeter partition valve (SP3V) and low profile liftpins assembly (LP2A) is also useful, however, in a wide variety of circumstances and applications. It is evident that those who are skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. All suitable modifications, implementations and equivalents are included in the scope of the invention as defined by the summary of the invention and the following claims:

The invention claimed is:

1. A substrate processing chamber comprising: a substrate supporting member located within a pressure sealed vessel; and a perimeter partition valve (PPV) dispersed within said vessel, said PPV comprising: an essentially continuous perimeter sealing slide; an essentially continuous perimeter seal within said slide; an essentially continuous perimeter sealing surface; and an actuator for moving said sealing slide between an open position and a closed position; said processing chamber characterized by: a perimeter gas distribution plenum; a perimeter gas flow drift channel in, serial fluidic communication downstream from said gas distribution plenum; and an inert gas supply port in serial fluidic communication upstream from said gas distribution plenum; an inert gas shutoff valve in serial fluidic communication upstream from said inert gas supply port; said perimeter gas flow drift channel comprising an outer end and an inner end; said outer end is substantially proximate to said perimeter seal; wherein said PPV confines a pressure sealed portion within said vessel when said perimeter sealing slide is actuated to said closed position; said pressure sealed is formed between said slide and said sealing surface using said seal; said pressure sealed portion comprising said substrate support member; and said PPV forms a perimeter access channel to said substrate support member when said PPV is actuated to said open position; wherein said gas distribution plenum communicates a substantially unified flow of inert gas from said inert gas supply port to said outer end of said drift channel when said shutoff valve is open; and said drift channel further communicates said inert gas into said pressure sealed portion of said vessel when said shutoff valve is open.

2. The substrate processing chamber as in claim 1 further comprising: a continuous sliding perimeter protection member; said sliding perimeter protection is attached to the inner side of said perimeter sealing slide; said sliding perimeter protection member forms said perimeter gas flow drift channel when said PPV is actuated to said closed position; and said perimeter protection member substantially covers the inner portion of said perimeter sealing slide.

3. The substrate processing chamber as in claim 2 further comprising: a stationary perimeter protection member; and a substantially restricted perimeter gas distribution plenum is formed between said sliding perimeter protection member and said stationary perimeter protection member when said PPV is actuated to said closed position.

4. The substrate processing chamber as in claim 2 wherein said sliding perimeter protection member defines a portion of the inner wall of said process chamber; and said sliding perimeter protection member forms a perimeter flow path with a substantially round top corner.

5. The substrate processing chamber as in claim 4 wherein said stationary perimeter protection member defines a portion of the inner wall of said process chamber; and said stationary perimeter protection member forms a perimeter flow path with a substantially round bottom corner.

6. The substrate processing chamber as in claim 1 further comprising: an outer perimeter seal; a vessel perimeter sealing surface; a lid; a lid perimeter sealing surface; said outer perimeter seal is dispersed within said slide; said outer perimeter seal forms a pressure tight communication with said vessel perimeter sealing surface when said PPV is actuated to said closed position; and said perimeter seal forms a pressure tight communication with said lid perimeter sealing surface when said PPV is actuated to said closed position wherein said lid is removable providing access to said chamber and said perimeter seal; and a pressure tight isolation between said chamber and said vessel is maintained when said PPV is actuated to said closed position and said lid is removed.

7. The substrate processing chamber as in claim 5 further comprising: an outer perimeter seal; a vessel perimeter sealing surface; a lid; a lid perimeter sealing surface; said outer perimeter seal is dispersed within said slide; said outer perimeter seal forms a pressure tight communication with said vessel perimeter sealing surface when said PPV is actuated to said closed position; and said perimeter seal forms a pressure tight communication with said lid perimeter sealing surface when said PPV is actuated to said closed position wherein said lid is removable providing access to said chamber and said perimeter seal; and a pressure tight isolation between said chamber and said vessel is maintained when said PPV is actuated to said closed position and said lid is removed.

8. The substrate processing chamber as in claim 1 further comprising: a substrate placement member; wherein said substrate placement member is actuated to provide vertical substrate translation; and said actuator is substantially contained within said process chamber.

9. The substrate processing chamber as in claim 8 wherein said actuator comprising pneumatic actuation.

10. The substrate processing chamber as in claim 2 further comprising: a substrate placement member; wherein said substrate placement member is actuated to provide vertical substrate translation; and said actuator is substantially contained within said process chamber.

11. The substrate processing chamber as in claim 5 further comprising: a substrate placement member; wherein said substrate placement member is actuated to provide vertical substrate translation; and said actuator is substantially contained within said process chamber.

12. The substrate processing chamber as in claim 7 further comprising: a substrate placement member including a vertical substrate placement actuator for providing vertical substrate translation; said processing chamber characterized by said actuator being substantially contained within said processing space.

13. The substrate processing chamber as in claim 12 wherein said actuator comprises a pneumatic actuator and wherein pressurizing said pneumatic actuator translates said substrate vertically up; and evacuating said pneumatic actuator translates said substrate vertically down.

14. A substrate processing system comprising: a substrate processing system vessel; a substrate processing chamber; and said processing system vessel comprising: a pressure tight vessel space; a top vessel plate, a bottom vessel plate; a top port; a bottom port; and said substrate processing chamber comprising: a perimeter partitioned assembly; a lid assembly; and said PPA comprising: a substrate supporting member; a perimeter partition valve (PPV); an essentially continuous perimeter sealing slide; a perimeter PPV bonnet; a substrate placement member; a pumping port; and an accessory port; said lid assembly comprising: a gas delivery manifold; wherein said bottom port is formed within said bottom vessel plate of said processing system vessel and said top port is formed within said top vessel plate of said processing system vessel; wherein said perimeter PPV bonnet is pressure sealed to said bottom port of said processing system vessel and said lid assembly is pressure sealed to said top port of said processing system vessel to form said substrate processing chamber, wherein said perimeter partition valve comprises a continuous perimeter seal within said slide; a continuous perimeter sealing surface; and an actuator for moving said sealing slide between an open position and a closed position.

15. The substrate processing system as in claim 14 wherein said substrate placement member is actuated to provide vertical substrate translation; and said actuation is substantially contained within said process chamber.

16. The substrate processing system as in claim 14 wherein said processing system vessel further comprising a substrate translating member.

17. The substrate processing system as in claim 16 further comprising: a load-lock chamber.

18. The substrate processing system as in claim 17 wherein said load-lock chamber comprising: a bottom load-lock assembly; and a top load-lock assembly; wherein said bottom load-lock assembly is pressure sealed to said bottom port of said processing system vessel and said top load-lock assembly is pressure sealed to said top port of said processing system vessel to form said load-lock chamber.

19. The substrate processing system as in claim 16 wherein said substrate placement member is actuated to provide vertical substrate translation; and said actuation is substantially contained within said process chamber.

20. The substrate processing system as in claim 17 wherein said substrate placement member is actuated to provide vertical substrate translation; and said actuation is substantially contained within said process chamber.

21. The substrate processing system as in claim 18 wherein said substrate placement member is actuated to provide vertical substrate translation; and said actuation is substantially contained within said process chamber.

22. The substrate processing system as in 19 wherein said processing is ALD.

23. The substrate processing system as in 20 wherein said processing is ALD.

24. The substrate processing system as in 21 wherein said processing is ALD.

25. The substrate processing system as in claim 16 wherein said substrate translating member comprising a substrate handling robot.

26. The substrate processing system as in claim 17 wherein said substrate translating member comprising a substrate handling robot.

27. The substrate processing system as in claim 18 wherein said substrate translating member comprising a substrate handling robot.

28. The substrate processing system as in claim 19 wherein said substrate translating member comprising a substrate handling robot.

29. The substrate processing system as in claim 20 wherein said substrate translating member comprising a substrate handling robot.

30. The substrate processing system as in claim 21 wherein said substrate translating member comprising a substrate handling robot.

31. The substrate processing system as in claim 16 wherein: said processing system comprising a plurality of processing chambers; said substrate translating member comprising a multiple lever rotation member; said multiple lever rotation member comprising: equally spaced number of substrate pickup levers; said number of levers equals the number of said plurality of processing chambers; and said substrate translating comprising: sequentially rotating all of said substrates in one direction; and sequentially processing all of said substrates.

32. The substrate processing system as in claim 17 wherein: said processing system comprising a plurality of processing chambers and a plurality of load-lock chambers; said substrate translating member comprising a multiple lever rotation member; said multiple lever rotation member comprising: equally spaced number of substrate pickup levers; said number of levers equals the sum of the number of said plurality of processing chambers and said plurality of load-lock chambers; and said substrate translating comprising: sequentially rotating all of said substrates in one direction; sequentially processing all of said substrates within said processing chambers; and handling said substrates within said load-lock chambers.

33. The substrate processing system as in claim 18 wherein: said processing system comprising a plurality of processing chambers and a plurality of load-lock chambers; said substrate translating member comprising a multiple lever rotation member; said multiple lever rotation member comprising: equally spaced number of substrate pickup levers; said number of levers equals the sum of the number of said plurality of processing chambers and said plurality of load-lock chambers; and, said substrate translating comprising: sequentially rotating all of said substrates in one direction; sequentially processing all of said substrates within said processing chambers; and handling said substrates within said load-lock chambers.

34. The substrate processing system as in claim 19 wherein: said processing system comprising a plurality of processing chambers; said substrate translating member comprising a multiple lever rotation member; said multiple lever rotation member comprising: equally spaced number of substrate pickup levers; said number of levers equals the number of said plurality of processing chambers; and said substrate translating comprising: sequentially rotating all of said substrates in one direction; and sequentially processing all of said substrates.

35. The substrate processing system as in claim 20 wherein: said processing system comprising a plurality of processing chambers and a plurality of load-lock chambers; said substrate translating member comprising a multiple lever rotation member; said multiple lever rotation member comprising: equally spaced number of substrate pickup levers; said number of levers equals the sum of the number of said plurality of processing chambers and said plurality of load-lock chambers; and said substrate translating comprising: sequentially rotating all of said substrates in one direction; sequentially processing all of said substrates within said processing chambers; and handling said substrates within said load-lock chambers.

36. The substrate processing system as in claim 21 wherein: said processing system comprising a plurality of processing chambers and a plurality of load-lock chambers; said substrate translating member comprising a multiple lever rotation member; said multiple lever rotation member comprising: equally spaced number of substrate pickup levers; said number of levers equals the sum of the number of said plurality of processing chambers and said plurality of load-lock chambers; and said substrate translating comprising: sequentially rotating all of said substrates in one direction; sequentially processing all of said substrates within said processing chambers; and handling said substrates within said load-lock chambers.

37. The substrate processing system as in claim 16 wherein: said processing system comprising a plurality of processing chambers; said plurality of processing chambers is substantially arranged on a single line; said substrate translating member comprising a multiple lever linear translation member; said multiple lever linear translation member comprising: equally spaced number of substrate pickup levers; said number of levers equals the number of said plurality of processing chambers; and said substrate translating comprising: sequentially translating all of said substrates in one direction; and sequentially processing all of said substrates.

38. The substrate processing system as in claim 17 wherein: said processing system comprising a plurality of processing chambers and two of said load-lock chambers; said plurality of processing chambers is substantially arranged on a single line; said load-lock chambers are arranged to be first and last within said line; said substrate translating member comprising a multiple lever linear translation member; said multiple lever linear translation member comprising: equally spaced number of substrate pickup levers; said number of levers equals the sum of the number of said plurality of processing chambers plus two; and said substrate translating comprising: sequentially translating all of said substrates in one direction from said first to said last; and sequentially processing all of said substrates within said processing chambers; placing a substrate in said first load-lock chamber; and removing a substrate from said last load-lock chamber.

39. The substrate processing system as in claim 18 wherein: said processing system comprising a plurality of processing chambers and two of said load-lock chambers; said plurality of processing chambers is substantially arranged on a single line; said load-lock chambers are arranged to be first and last within said line; said substrate translating member comprising a multiple lever linear translation member; said multiple lever linear translation member comprising: equally spaced number of substrate pickup levers; said number of levers equals the sum of the number of said plurality of processing chambers plus two; and said substrate translating comprising: sequentially translating all of said substrates in one direction from said first to said last; and sequentially processing all of said substrates within said processing chambers; placing a substrate in said first load-lock chamber; and removing a substrate from said last load-lock chamber.

40. The substrate processing system as in claim 19 wherein: said processing system comprising a plurality of processing chambers; said plurality of processing chambers is substantially arranged on a single line; said substrate translating member comprising a multiple lever linear translation member; said multiple lever linear translation member comprising: equally spaced number of substrate pickup levers; said number of levers equals the number of said plurality of processing chambers; and said substrate translating comprising: sequentially translating all of said substrates in one direction; and sequentially processing all of said substrates.

41. The substrate processing system as in claim 20 wherein: said processing system comprising a plurality of processing chambers and two of said load-lock chambers; said plurality of processing chambers is substantially arranged on a single line; said load-lock chambers are arranged to be first and last within said line; said substrate translating member comprising a multiple lever linear translation member; said multiple lever linear translation member comprising: equally spaced number of substrate pickup levers; said number of levers equals the sum of the number of said plurality of processing chambers plus two; and said substrate translating comprising: sequentially translating all of said substrates in one direction from said first to said last; and sequentially processing all of said substrates within said processing chambers; placing a substrate in said first load-lock chamber; and removing a substrate from said last load-lock chamber.

42. The substrate processing system as in claim 21 wherein: said processing system comprising a plurality of processing chambers and two of said load-lock chambers; said plurality of processing chambers is substantially arranged on a single line; said load-lock chambers are arranged to be first and last within said line; said substrate translating member comprising a multiple lever linear translation member; said multiple lever linear translation member comprising: equally spaced number of substrate pickup levers; said number of levers equals the sum of the number of said plurality of processing chambers plus two; and said substrate translating comprising: sequentially translating all of said substrates in one direction from said first to said last; and sequentially processing all of said substrates within said processing chambers; placing a substrate in said first load-lock chamber; and removing a substrate from said last load-lock chamber.

43. The substrate processing system as in claim 25 wherein said system is attached to a wafer handling chamber; and said attached wafer handling chamber comprising: a slit formed in the wall of said pressure tight vessel space; and a slit valve forming a pressure tight communication with said processing system and said wafer handling system.

44. The substrate processing system as in claim 28 wherein said system is attached to a wafer handling chamber; and said attached wafer handling chamber comprising: a slit formed in the wall of said pressure tight vessel space; and a slit valve forming a pressure tight communication with said processing system and said wafer handling system.

45. The substrate processing system as in claim 31 wherein said system is attached to a wafer handling chamber; and said attached wafer handling chamber comprising: a slit formed in the wall of said pressure tight vessel space; and a slit valve forming a pressure tight communication with said processing system and said wafer handling system.

46. The substrate processing system as in claim 34 wherein said system is attached to a wafer handling chamber; and said attached wafer handling chamber comprising: a slit formed in the wall of said pressure tight vessel space; and a slit valve forming a pressure tight communication with said processing system and said wafer handling system.

47. The substrate processing system as in claim 37 wherein said system is attached to a wafer handling chamber; and said attached wafer handling chamber comprising: a slit formed in the wall of said pressure tight vessel space; and a slit valve forming a pressure tight communication with said processing system and said wafer handling system.

48. The substrate processing system as in claim 40 wherein said system is attached to a wafer handling chamber; and said attached wafer handling chamber comprising: a slit formed in the wall of said pressure tight vessel space; and a slit valve forming a pressure tight communication with said processing system and said wafer handling system.

49. The substrate processing system as in claim 48 wherein said multiple lever linear translation member comprising: a first set of levers; a second set of levers; said first set of levers and said second set of levers are spaced to substantially match the center to center distance between said process chambers; said levers are translatable forward and backward in the direction of said single line; wherein sequentially translating all of said substrates comprising: removing a completed substrate from a last processing chamber elevating said substrates using said substrate placement member; moving first set of levers backwards to substantially locate under said substrates; moving second set of lever forwards substantially locate under said substrates; lowering said substrates using said substrate placement member; translating said substrates forwards to the next said processing chamber by moving said first set of levers and said second set of levers concurrently; Moving said first set of lever forward and moving said second set of levers backwards to substantially locate between said processing chambers; and Loading a substrate into a first processing chamber.

50. The substrate processing system as in claim 41 wherein said multiple lever linear translation member comprising: a first set of levers; a second set of levers; said first set of levers and said second set of levers are spaced to substantially match the center to center distance between said process chambers; said levers are translatable forward and backward in the direction of said single line; wherein sequentially translating all of said substrates comprising: removing a completed substrate from said last load-lock chamber elevating said substrates using said substrate placement member; moving first set of levers backwards to substantially locate under said substrates; moving second set of lever forwards substantially locate under said substrates; lowering said substrates using said substrate placement member; translating said substrates forwards to the next said processing chamber by moving said first set of levers and said second set of levers concurrently; Moving said first set of lever forward and moving said second set of levers backwards to substantially locate between said processing chambers; and Loading a substrate into said first load-lock chamber.

* * * * *